(12) United States Patent
Yamaguchi et al.

(10) Patent No.: US 7,295,304 B2
(45) Date of Patent: Nov. 13, 2007

(54) MASK DEFECT INSPECTING METHOD, SEMICONDUCTOR DEVICE MANUFACTURING METHOD, MASK DEFECT INSPECTING APPARATUS, DEFECT INFLUENCE MAP GENERATING METHOD, AND COMPUTER PROGRAM PRODUCT

(75) Inventors: Shinji Yamaguchi, Tokyo (JP); Soichi Inoue, Yokohama (JP); Satoshi Tanaka, Kawasaki (JP); Mari Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 388 days.

(21) Appl. No.: 10/654,527

(22) Filed: Sep. 4, 2003

(65) Prior Publication Data
US 2004/0115541 A1    Jun. 17, 2004

(30) Foreign Application Priority Data
Sep. 5, 2002   (JP)   ............ 2002-260428
Sep. 13, 2002  (JP)   ............ 2002-268659

(51) Int. Cl.
   *G01N 21/00*   (2006.01)
(52) U.S. Cl. ............... 356/237.5; 356/237.4
(58) Field of Classification Search ........... 356/389, 356/394, 398, 237.1, 237.4
   See application file for complete search history.

(56) References Cited

U.S. PATENT DOCUMENTS 4,586,822 A * 5/1986 Tanimoto ............ 356/394
4,623,256 A * 11/1986 Ikenaga et al. ............ 356/394
6,023,328 A * 2/2000 Pierrat ............ 356/237.4
6,038,019 A * 3/2000 Chang et al. ............ 356/237.3
6,221,539 B1   4/2001 Kotani et al.
6,701,004 B1 * 3/2004 Shykind et al. ............ 382/149
6,797,526 B2 * 9/2004 Tanaka et al. ............ 438/5
7,218,389 B2 * 5/2007 Uto et al. ............ 356/237.5

FOREIGN PATENT DOCUMENTS

| JP | 2000-98584 | 4/2000 |
| JP | 2002-100548 | 4/2002 |
| JP | 2002-244275 | 8/2002 |

OTHER PUBLICATIONS

Notification of Reasons for Rejection, issued by Japanese Patent Office, mailed Mar. 1, 2005, in Japanese Patent Application No. 2002-260428, and English-language translation thereof.

* cited by examiner

*Primary Examiner*—Gregory J. Toatley, Jr.
*Assistant Examiner*—Juan D. Valentin, II
(74) *Attorney, Agent, or Firm*—Finnegan, Henderson, Farabow, Garrett & Dunner, L.L.P.

(57) ABSTRACT

A mask defect inspecting method comprises preparing detection sensitivities of defects on a plurality of portions of a mask pattern on a photomask, the detection sensitivities being determined according to influences of the defects upon a wafer, and inspecting defects on the plurality of portions based on the detection sensitivities.

17 Claims, 20 Drawing Sheets

$\Delta I_{21} = (I_{21} - I_e)/I_e$ $\Delta I_{22} = (I_{22} - I_e)/I_e$ $\Delta I_{25} = (I_{25} - I_e)/I_e$

| Detection sensitivity | Opaque | Clear |
|---|---|---|
| K | 130 | 180 |
| L | 130 | 220 |
| M | 180 | 180 |
| N | 180 | 220 | unit=nm

| Divided region | Opaque defect | Clear defect | Inspection sensitivity |
|---|---|---|---|
| A-B (i=1) | 130 | 180 | K |
| B-C (i=2) | 180 | 220 | N |
| D-E (i=3) | 130 | 220 | L |
| E-F (i=4) | 180 | 180 | M |
| ⋮ | ⋮ | ⋮ | ⋮ | unit:nm

| Inspection sesitivity | Threshold value |
|---|---|
| K | 25 |
| L | 32 |
| M | 37 |
| N | 43 | unit=level

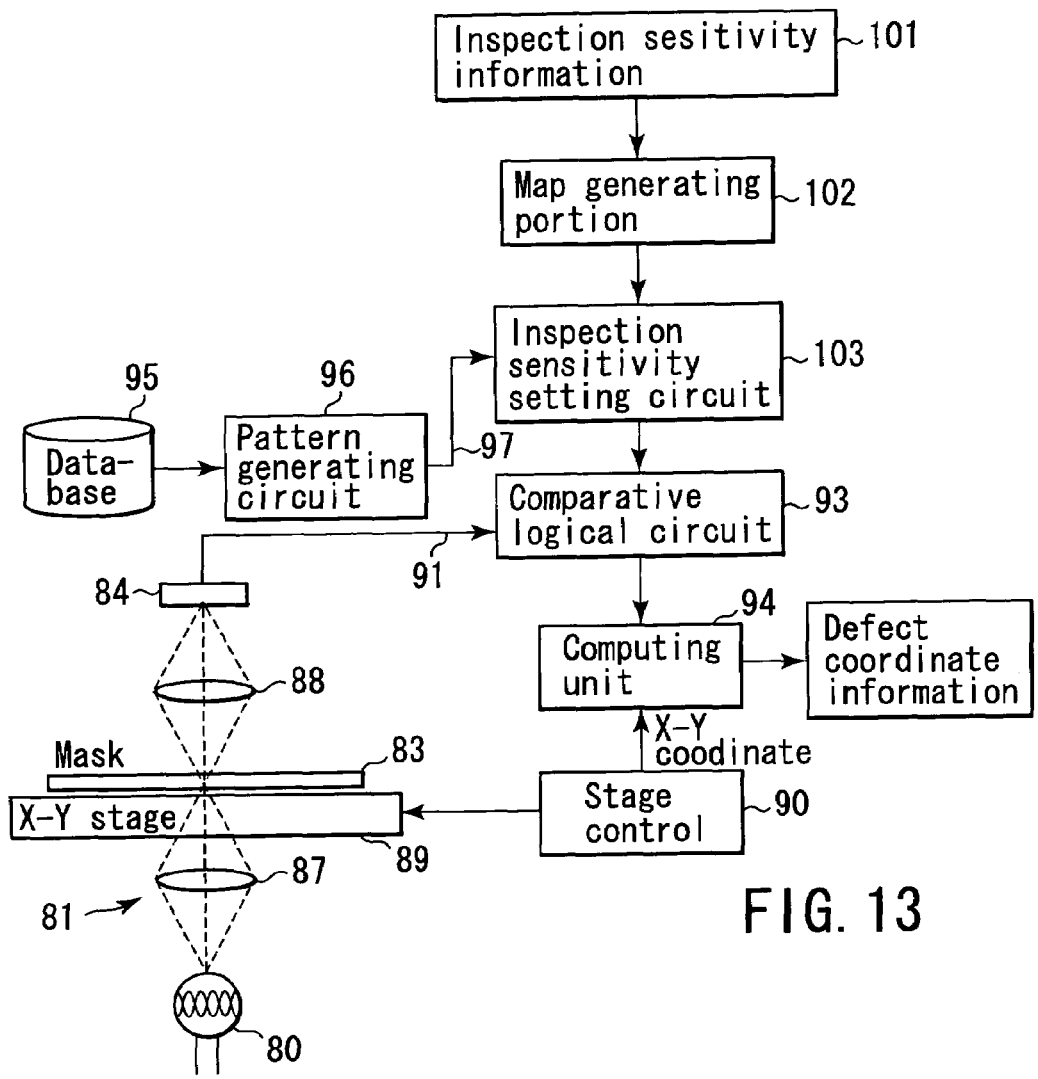
FIG. 13
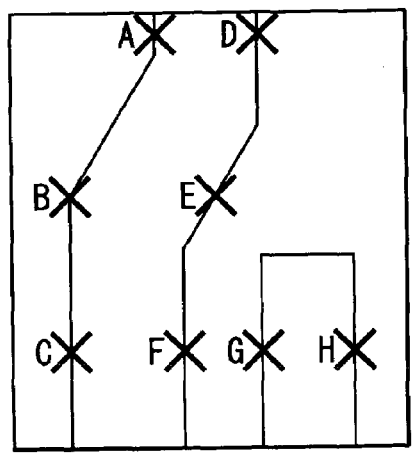
FIG. 14A
| Segment | Dimensional variation rate |
|---------|---------------------------|
| A-D | -12 |
| B-E | -6 |
| . | . |
| . | . |
| . | . |
| . | . |
unit : %
FIG. 14B

| K | K | K | K | K | K | L | L | L | L | N | N |
|---|---|---|---|---|---|---|---|---|---|---|---|
| K | K | K | K | K | K | L | L | L | L | N | N |
| K | K | K | K | K | K | L | L | L | L | N | N |
| K | K | K | K | K | K | L | L | L | N | N | N |
| K | K | K | K | K | L | L | L | N | N | N | N |
| K | N | N | N | N | N | N | N | N | N | N | N |
| N | N | N | N | M | M | N | N | N | N | N | N |
| N | N | N | M | M | M | M | N | N | N | N | N |
| N | N | N | M | M | M | M | N | N | N | N | N |
| N | N | N | M | M | M | M | N | N | N | N | N |
| N | N | N | M | M | M | M | N | N | N | N | N |
| N | N | N | N | N | N | N | N | N | N | N | N |
| N | N | N | N | N | N | N | N | N | N | N | N |
| N | N | N | N | N | N | N | N | N | N | N | N |

FIG. 17A

| Inspection sensitivity | Opaque | Clear |
|---|---|---|
| K | 130 | 180 |
| L | 130 | 220 |
| M | 180 | 180 |
| N | 180 | 220 | unit=nm

| 0 | 0 | 0 | 0 | 125 | 240 | 240 | 125 | 0 | 0 | 0 | 0 |
|---|---|---|---|---|---|---|---|---|---|---|---|
| 0 | 0 | 0 | 0 | 202 | 240 | 240 | 125 | 0 | 0 | 0 | 0 |
| 0 | 0 | 0 | 60 | 230 | 240 | 240 | 125 | 0 | 0 | 0 | 0 |
| 0 | 0 | 0 | 180 | 240 | 240 | 240 | 115 | 0 | 0 | 0 | 0 |
| 0 | 0 | 100 | 220 | 240 | 240 | 225 | 40 | 0 | 0 | 0 | 0 |
| 0 | 40 | 180 | 240 | 240 | 240 | 120 | 0 | 0 | 0 | 0 | 0 |
| 0 | 80 | 240 | 240 | 240 | 225 | 40 | 0 | 0 | 0 | 0 | 0 |
| 0 | 80 | 240 | 240 | 240 | 186 | 0 | 25 | 60 | 60 | 25 | 0 |
| 0 | 80 | 240 | 240 | 240 | 75 | 0 | 94 | 240 | 240 | 102 | 0 |
| 0 | 80 | 240 | 240 | 240 | 75 | 0 | 94 | 240 | 240 | 102 | 0 |
| 0 | 80 | 240 | 240 | 240 | 75 | 0 | 94 | 240 | 240 | 102 | 0 |
| 0 | 80 | 240 | 240 | 240 | 75 | 0 | 94 | 240 | 240 | 102 | 0 |
| 0 | 80 | 240 | 240 | 240 | 75 | 0 | 94 | 240 | 240 | 102 | 0 |
| 0 | 80 | 240 | 240 | 240 | 75 | 0 | 94 | 240 | 240 | 102 | 0 |

FIG. 18B

| 0 | 0 | 0 | 0 | 125 | 240 | 240 | 125 | 0 | 0 | 0 | 0 |
|---|---|---|---|---|---|---|---|---|---|---|---|
| 0 | 0 | 0 | 0 | 215 | 240 | 240 | 125 | 0 | 0 | 0 | 0 |
| 0 | 0 | 0 | 80 | 240 | 240 | 240 | 125 | 0 | 0 | 0 | 0 |
| 0 | 0 | 0 | 180 | 240 | 240 | 240 | 120 | 0 | 0 | 0 | 0 |
| 0 | 0 | 100 | 220 | 240 | 240 | 225 | 50 | 0 | 0 | 0 | 0 |
| 0 | 50 | 180 | 240 | 240 | 240 | 120 | 0 | 0 | 0 | 0 | 0 |
| 0 | 80 | 240 | 240 | 240 | 225 | 50 | 0 | 0 | 0 | 0 | 0 |
| 0 | 80 | 240 | 240 | 240 | 190 | 0 | 25 | 60 | 60 | 25 | 0 |
| 0 | 80 | 240 | 240 | 240 | 75 | 0 | 94 | 240 | 240 | 102 | 0 |
| 0 | 80 | 240 | 240 | 240 | 75 | 0 | 94 | 240 | 240 | 102 | 0 |
| 0 | 80 | 240 | 240 | 240 | 80 | 0 | 94 | 240 | 240 | 102 | 0 |
| 0 | 80 | 240 | 240 | 240 | 80 | 40 | 94 | 240 | 240 | 102 | 0 |
| 0 | 80 | 240 | 240 | 240 | 83 | 41 | 94 | 240 | 240 | 102 | 0 |
| 0 | 80 | 240 | 240 | 240 | 100 | 0 | 94 | 240 | 240 | 102 | 0 |

| 0 | 0 | 0 | 0 | 0 | 0 | 0 | 0 | 0 | 0 | 0 | 0 |
|---|---|---|---|---|---|---|---|---|---|---|---|
| 0 | 0 | 0 | 0 | 13 | 0 | 0 | 0 | 0 | 0 | 0 | 0 |
| 0 | 0 | 0 | 20 | 10 | 0 | 0 | 0 | 0 | 0 | 0 | 0 |
| 0 | 0 | 0 | 0 | 0 | 0 | 5 | 0 | 0 | 0 | 0 | 0 |
| 0 | 0 | 0 | 0 | 0 | 0 | 10 | 0 | 0 | 0 | 0 | 0 |
| 0 | 10 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 |
| 0 | 0 | 0 | 0 | 0 | 4 | 0 | 0 | 0 | 0 | 0 | 0 |
| 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 |
| 0 | 0 | 0 | 0 | 0 | 5 | 0 | 0 | 0 | 0 | 0 | 0 |
| 0 | 0 | 0 | 0 | 0 | 5 | 40 | 0 | 0 | 0 | 0 | 0 |
| 0 | 0 | 0 | 0 | 0 | 8 | 41 | 0 | 0 | 0 | 0 | 0 |
| 0 | 0 | 0 | 0 | 0 | 25 | 0 | 0 | 0 | 0 | 0 | 0 |

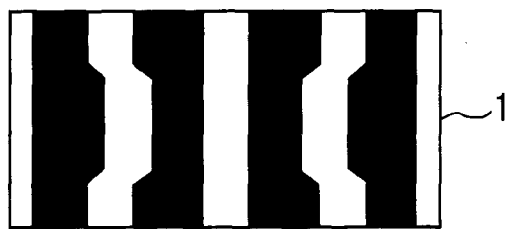
FIG. 25
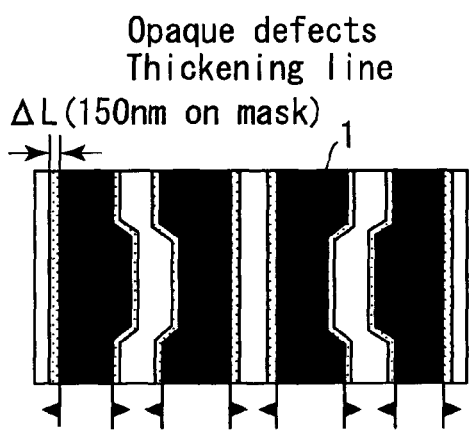
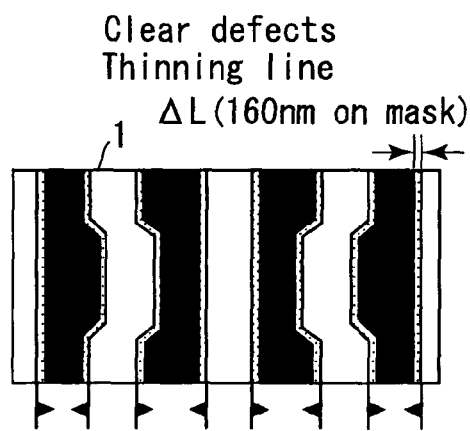
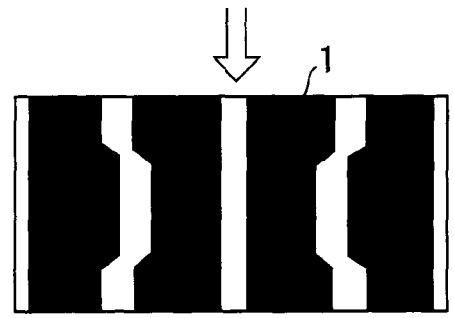
After resize processing carried out for design data taking defect specification of opaque defects into consideration
FIG. 26A
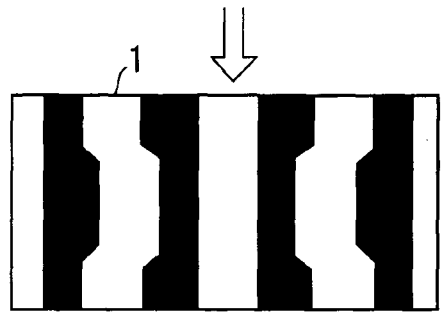
After resize processing carried out for design data taking defect specification of clear defects into consideration
FIG. 26B

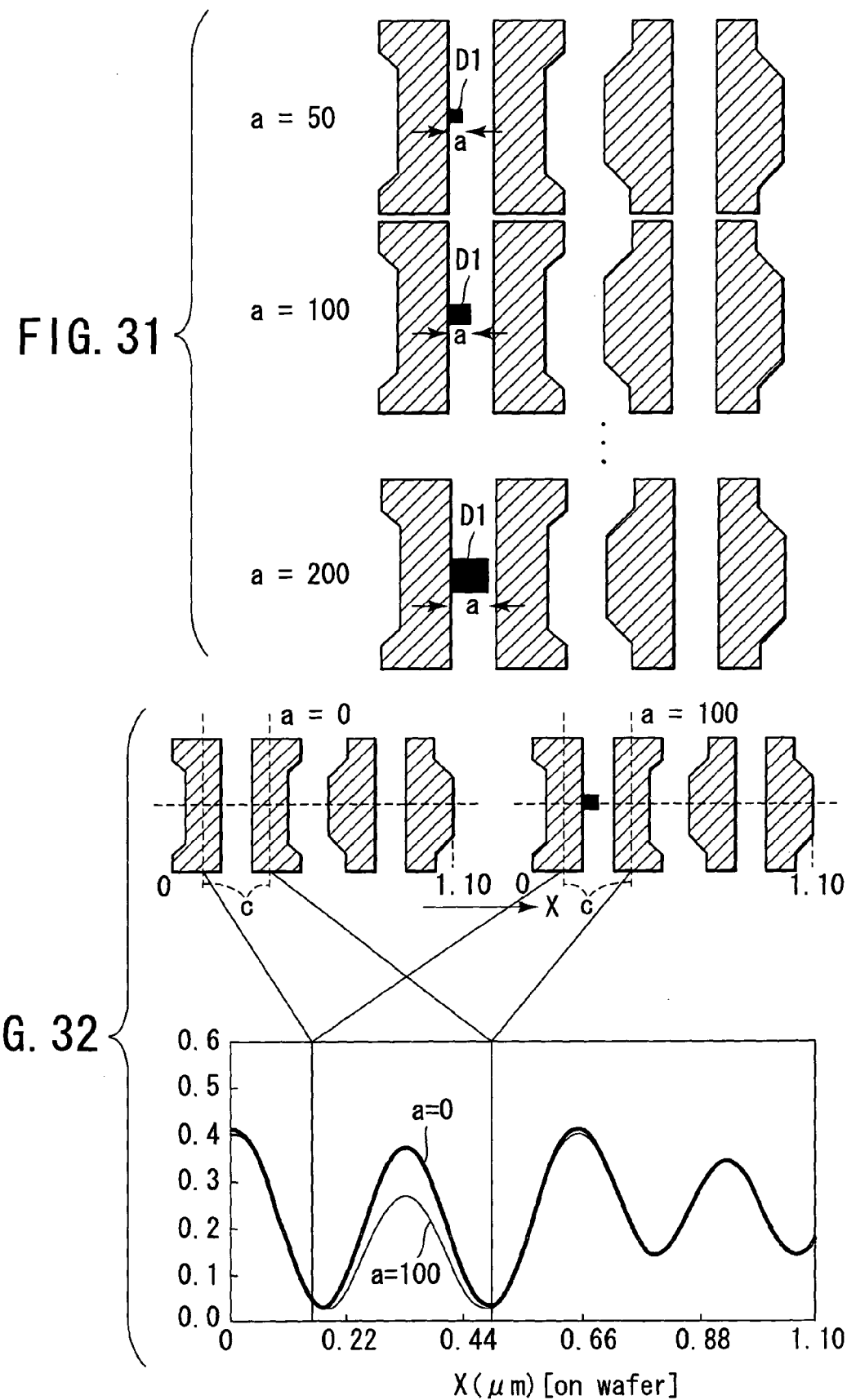

MASK DEFECT INSPECTING METHOD, SEMICONDUCTOR DEVICE MANUFACTURING METHOD, MASK DEFECT INSPECTING APPARATUS, DEFECT INFLUENCE MAP GENERATING METHOD, AND COMPUTER PROGRAM PRODUCT

CROSS-REFERENCE TO RELATED APPLICATIONS

This application is based upon and claims the benefit of priority from the prior Japanese Patent Applications No. 2002-260428, filed Sep. 5, 2002; and No. 2002-268659, filed Sep. 13, 2002, the entire contents of both of which are incorporated herein by reference.

BACKGROUND OF THE INVENTION

1. Field of the Invention

The present invention relates to a mask defect inspecting method for a photomask used in a lithography process for a semiconductor device; a semiconductor device manufacturing method including the process of inspecting the photomask; a mask defect inspecting apparatus; a method for generating a defect influence map used in mask defect inspection of the photomask; a photomask evaluating method; and a computer program product.

2. Description of the Related Art

In recent years, in manufacture of a semiconductor memory device, high integration of elements, wirings and the like configuring a circuit or fining of a pattern of elements, wirings and the like is underway. For example, in the case of a DRAM (Dynamic Random Access Memory) which is a typical semiconductor memory device, it is necessary to form a pattern of 0.13 microns in design rule in fabrication of a 1G DRAM.

Conventionally photomask inspection is carried out by using a die-to-die comparative inspecting technique for comparing the same adjacent patterns with each other or a die-to-data base comparative inspecting technique for comparing a measuring pattern with a design pattern.

FIG. 21 is a schematic diagram depicting a defect inspecting apparatus for use in the conventional die-to-die comparative inspecting technique. The above-described defect inspecting apparatus comprises a light source 80, optical systems 81 and 82, and image sensors 84 and 85 such as CCD. In the above defect inspecting apparatus, the two optical systems 81 and 82 are used for such one light source 80.

A magnified image of a pattern of transmission light from the same two adjacent patterns formed on a photomask 83 is formed on the image sensors 84 and 85. As a result, the magnified image of the pattern of the above-described transmission light is converted into an electronic signal.

The optical systems 81 and 82 each include a reflection mirror 86 and objective lenses 87 and 88. The photomask 83 is placed on an X-Y stage 89. A position of the X-Y stage 89 is controlled by a stage control mechanism 90.

Electronic signals (sensor data) 91 and 92 obtained by the image sensors 84 and 85 are inputted into a comparative logical circuit 93. The comparative logical circuit 93 compares the electronic signals 91 and 92 with each other, and detects an unmatched portion (defect) on a pattern.

A computing unit 94 computes a coordinate of the above-described unmatched portion on the photomask 83 based on position information (X-Y coordinate) on the X-Y stage 89 from the stage control mechanism 90. The above-described coordinate is recorded as detect position information on a mask defect in a defect inspecting apparatus.

On the other hand, FIG. 22 shows a defect inspecting apparatus for use in the conventional die-to-data base comparative inspecting technique. A pattern generating circuit 96 generates a reference pattern 97 by using a design pattern stored in a data base 95. The comparative logical circuit 93 compares the reference pattern 97 with the sensor data 91 obtained from the optical system 81, and detects an unmatched portion of the pattern.

The computing unit 94 computes a coordinate of the above-described unmatched portion on the photomask 83 based on the unmatched portion detected by means of the comparative logical circuit 93 and the X-Y coordinate of the X-Y stage 89. The above coordinate is recorded as defect position information on a defect on a photomask (mask defect) in the defect inspecting apparatus.

However, the conventional die-to-die comparative inspecting technique and die-to-data base comparative inspecting technique have the following problems.

In a photomask, even if design rules are identical to each other, patterns of various sizes are allocated at portions. Therefore, an effect of a mask defect on a resist pattern (transferred pattern) upon a wafer, or an effect upon operation (feature) of a device to be formed on the wafer is different depending on a variety of portions of a pattern region in the photomask.

Here, the conventional die-to-die comparative inspecting technique and die-to-data base comparative inspecting technique are carried out without taking into consideration an effect of a mask defect on a resist pattern or device operation. Specifically, with respect to a controlled dimensional pattern determined for each design rule, in-plane inspection of a single photomask is carried out with detection sensitivity which should detect defect specification of a predetermined size.

In this way, the conventional photomask detection is carried out with uniform detection sensitivity without any discrimination of a portion at which a mask defect has an effect on a resist pattern or device operation or a portion at which the mask defect does not have an effect thereon. Thus, at some portions in an inspection region, inspection is occasionally carried out with detection sensitivity which is severer than necessary.

If inspection is carried out with detection sensitivity which is severer than necessary, a portion which is not essentially regarded as a mask defect may be detected as a mask defect (a pseudo defect). Thus, detecting defects of more types than necessary occurs, and a large amount of time is required for classification of the detected mask defects. In this manner, there occurs a problem that a photomask manufacturing period is prevented from being reduced, and, as a result, a semiconductor manufacturing period is prevented from being reduced.

In addition, as described above, the conventional die-to-die comparative inspecting technique and die-to-data base comparative inspecting technique fail to take into consideration an effect of a mask detect on a resist pattern or device operation. Thus, discrimination between a mask defect (pseudo defect) which does not have an effect on a resist pattern or device operation and a mask defect which has an effect thereon is not clear when an inspection result is obtained.

Because of this, verification of an effect of each mask defect on a resist pattern is carried out with a lithography simulation microscope (for example, MSM 100 available from Karl Zeiss Co., Ltd.) based on defect position information (defect coordinate), and the verified results are classified into a mask defect which has an effect on a resist pattern and a mask defect which does not an effect thereon. Then, with respect to the mask defect which has an effect on transfer, correction is carried out, and a photomask is shipped.

In this way, making discrimination between a mask defect which has an effect on a resist pattern or device operation and a mask defect which does not have an effect thereon causes an increase of manufacturing steps in number. In this manner, there occurs a problem that the photomask manufacturing period is prevented from being reduced, and, as a result, the semiconductor device manufacturing period is prevented from being reduced.

On the other hand, dimensional precision and defect specification required for a photomask for forming a circuit pattern is becoming rapidly more severe with fining. Therefore, the lowered yield in the photomask manufacturing steps is becoming problem.

Even if design rules are identical to each other, patterns of various sizes are allocated in the photomask. For example, a DRAM includes a cell portion whose pattern size is equal to that in design rule; and a peripheral circuit portion whose pattern size is greater than that in design rule is allocated.

It is considered that the cell portion includes a portion which is greatly affected by a mask defect and a portion which is less affected thereby. The mask defect influence used here include an effect of a mask defect upon a resist pattern (transferred pattern) on a wafer and an effect of a mask defect on operation (feature) of a device to be formed on the wafer.

Therefore, in the control of a photomask, it is considered rather more desirable to carry out inspection by classifying the mask in-plane into a severe portion and a not-severe portion than to carry out inspection with uniform severity.

From the foregoing, it is considered that a photomask to be judged as a good product exists from the viewpoint of a wafer among photomasks which have been conventionally disposed after judged to be a faulty product. Therefore, it will be increasingly more important to control a photomask from the viewpoint of a wafer in the improvement of yield in the photomask manufacturing process, and further, in the reduction of photomask price.

In the meantime, critical area analysis is known as one of techniques for predicting the yield of wafers, which has been developed from circuit design technology. With respect to a critical area computing method, for example, Jpn. Pat. Appln. KOKAI Publication No. 2002-100548 discloses two techniques, i.e., a wiring width expanding technique (geometry technique) and a Monte Calro technique.

The term "critical area" used here denotes an area which causes a fatal fault such as short-circuit between lines on a wafer in the case where a defect center exists. In addition, this type of defect is also called a killer defect.

FIG. 37A to FIG. 37C are conceptual views each showing a killer defect and a critical area with the geometry technique for use in a conventional circuit design technology.

FIG. 37A shows a foreign matter which causes a killer defect (left side) and a foreign matter which does not cause the killer defect (right side). The geometry technique assumes a circular electrically conductive foreign matter on a wafer. If wirings are connected to each other with a foreign matter, short-circuit occurs.

FIG. 37B shows an area which serves as a critical area. If the center of a foreign matter exists, an area with its minimum square area in which wirings are connected to each other with the foreign matter is defined as a critical area.

FIG. 37C shows a method of computing a critical area. Defined as a critical area is a region between wirings in which edges opposite to each other with respect to two adjacent wirings (lines) are left by increasing their wiring widths each by R/2 in radius of a critical matter.

A critical area exists for each size of the foreign matter. This critical area configures a distribution with respect to the size of foreign matter. The critical area distribution is given by a function indicating a relationship between the size of the foreign matter and the corresponding square area of the critical area.

A method for predicting the yield of photomasks includes using the above-described critical area analysis. However, even if the critical area analysis is applied intact to the yield of photomasks, it is difficult to achieve prediction of the yield of photomasks. The reason will be described below.

A photomask pattern is transferred onto a wafer, but the foreign matter on the photomask is not transferred onto the wafer while it is kept unchanged in shape. Thus, an effect of the foreign matter on the photomask upon a wiring pattern to be formed on the wafer is not always the same as that of the foreign matter on the wafer upon a wiring pattern.

Therefore, in the case where the prediction of the yield of photomasks has been carried out by using the conventional critical area analysis, a photomask to be judged as a good product exists from the viewpoint of wafer among the photomasks which have been judged to be a faulty product. In this case, the prediction of the yield of photomasks is incorrect.

In addition, on a photomask, a opaque defect and a clear defect exist as typical defects which have an effect on a wafer. The opaque defect used here denotes a defect which occurs when a light shield film or a semi-transparent film has remained on a transparent substrate at a portion which is essentially an exposed pattern. The white defect used here denotes a defect which occurs when a light shield film or a semi-transparent film has slipped off from the top of a transparent substrate at a portion which is essentially a reserved pattern.

Accordingly, in order to predict the yield of photomasks, it is required to compute a critical area separately with respect to such opaque and clear defects. However, there is no way for a wafer to discriminate these opaque and clear defects. Thus, in the conventional critical area analysis, the critical areas of the opaque and clear defects are not computed.

In short, the conventional critical area analysis is essentially a technique for predicting the yield of wafers. Thus, no consideration is taken into effective information for predicting the yield of photomasks, i.e., defect inspection information (mask defect information) used when a defect on a photomask is inspected. Therefore, even if the conventional critical area analysis is applied intact to the yield of photomasks, it is difficult to achieve a practical method for predicting the yield of photomasks.

BRIEF SUMMARY OF THE INVENTION

A mask defect inspecting method according to an aspect of the present invention comprises preparing detection sensitivities of defects on a plurality of portions of a mask pattern on a photomask, the detection sensitivities being determined according to influences of the defects upon a wafer; and inspecting defects on the plurality of portions based on the detection sensitivities.

A semiconductor device manufacturing method according to an aspect of the present invention comprises preparing a photomask including a mask pattern; inspecting the photomask by a mask defect inspecting method, the mask defect inspecting method comprising: preparing detection sensitivities of defects on a plurality of portions of the mask pattern on a photomask, the detection sensitivities being determined according to influences of the defects upon a wafer; and inspecting defects on the plurality of portions based on the detection sensitivities.

A mask defect inspecting apparatus according to an aspect of the present invention comprises a map generating portion to generate an influence map representing influences of defects on a plurality of portions of a mask pattern on a photomask upon a wafer based on detection sensitivities of the defects; and an inspecting portion to inspect defects on the plurality of portions based on the influence map.

A defect influence map generating method according to an aspect of the present invention comprises preparing detection sensitivities of defects on a plurality of portions of a mask pattern on a photomask, the detection sensitivities being determined according to influences of the defects upon a wafer; and generating an influence map including the influences of the defects upon the wafer based on the detection sensitivities of the defects.

A photomask evaluating method according to an aspect of the present invention comprises generating pattern data considering defects by using a defect inspection information used in inspecting defects on a photomask, the pattern data considering defects representing design pattern data of the photomask on which information concerning the defects is reflected; computing a critical area distribution with respect to the pattern data considering defects and estimating a defect density distribution with respect to a relationship between sizes of defects on the photomask and number of defects of the sizes per unit square area on the photomask; acquiring information concerning number of defects on the photomask based on the critical area distribution and the defect density distribution; and evaluating the photomask based on the information concerning the number of defects on the photomask.

A computer program product configured to store program instructions for execution on a computer system according to an aspect of the present invention enables the computer system to perform inputting detection sensitivities of defects on a plurality of portions of a mask pattern on a photomask, the detection sensitivities being determined according to influences of the defects upon a wafer; and inspecting defects on the plurality of portions based on the detection sensitivities.

A computer program product configured to store program instructions for execution on a computer system according to another aspect of the present invention enables the computer system to perform preparing detection sensitivities of defects on a plurality of portions of a mask pattern on a photomask, the detection sensitivities being determined according to influences of the defects upon a wafer; and generating an influence map including the influences of the defects upon the wafer based on the detection sensitivities of the defects.

A computer program product configured to store program instructions for execution on a computer system according to another aspect of the present invention enables the computer system to perform generating pattern data considering defects by using a defect inspection information used in inspecting defects on a photomask, the pattern data considering defects representing design pattern data of the photomask on which information concerning the defects is reflected; computing a critical area distribution with respect to the pattern data considering defects and estimating a defect density distribution with respect to a relationship between sizes of defects on the photomask and number of defects of the sizes per unit square area on the photomask; acquiring information concerning number of defects on the photomask based on the critical area distribution and the defect density distribution; and evaluating the photomask based on the information concerning the number of defects on the photomask.

BRIEF DESCRIPTION OF THE SEVERAL VIEWS OF THE DRAWING

FIG. 13 is a schematic diagram depicting a defect inspecting apparatus for carrying out die-to-due comparative inspection of the first embodiment;

FIG. 14A and FIG. 14B are views each illustrating the steps of acquiring an allowable line width variation rate with respect to segments, each of which is defined at two adjacent dividing points according to the second embodiment;

FIG. 17A and FIG. 17B are views each showing a defect influence map;

FIG. 18A and FIG. 18B are views each showing an example of reference data and sensor data in a comparator circuit using the defect influence map;

FIG. 25 is a view showing design pattern data (GDS data) according to the fourth embodiment;

FIG. 26A and FIG. 26B are views each showing the steps of (procedures for) carrying out re-size processing of black and white defects separately in accordance with a mask defect specification for the design pattern data shown in FIG. 25;

FIG. 31 is a view showing a pattern of defect sizes a=50, 100, 150, 200 nm$^\square$.

FIG. 32 is a view showing a computation example of light intensity distributions of a defect free pattern and the pattern shown in FIG. 30A;

DETAILED DESCRIPTION OF THE INVENTION

Hereinafter, embodiments of the present invention will be described with reference to the accompanying drawings.

First Embodiment

Figure 1:
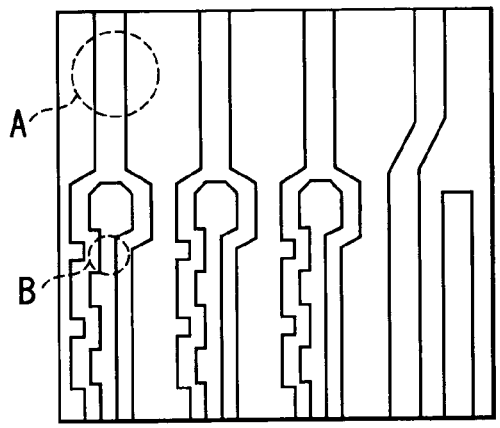
FIG. 1 is a plan view illustrating a basic conceptual diagram of a method for inspecting a photomask according to the first embodiment.

First, a description will be given with respect to a basic concept of a method for inspecting a photomask according to the first embodiment of the invention. FIG. 1 shows a photomask, wherein upper-case letter A denotes a region in which a line pattern with its large line width exists; and upper-case letter B denotes a region in which a line pattern with its small line width exists.

Here, in the case where mask defects of the same size and shape have existed in region A and region B, the mask defect in region B has a greater effect on a wafer. Namely, the mask defect in region B has a greater effect on a resist pattern (transferred pattern) to be formed on the wafer. Conversely, the mask defect in region A has a smaller effect on the transferred pattern, which can be occasionally ignored.

In a conventional method and apparatus for inspecting a photomask, in the case where design rules are identical to each other, the detection sensitivities are identical to each other in all patterns. Because of this, a mask defect may be detected in region A and region B. That is, a portion in region A may be detected as a pseudo defect.

In the present embodiment, therefore, for each of a plurality of portions in a mask pattern, the detection sensitivity of a mask defect is determined depending on the influence of the mask defect thereon. For example, the defect detection sensitivity of a pattern in region A is lowly set, and the defect detection sensitivity of a pattern in region B is highly set.

In this way, mask inspection is carried out in consideration of an effect of a mask defect upon a resist pattern, whereby the pseudo defect detected in region A is reduced. The pseudo defect is reduced, whereby the photomask or semiconductor device manufacturing period is reduced.

Consideration may be taken into an effect of a mask defect upon device operation instead of an effect of a mask defect upon a resist pattern. An effect of a mask defect upon device operation will be described in a second embodiment of the invention. In addition, the effects of mask defects upon a transferred pattern and device operation may be taken into consideration at the same time.

Now, a method for inspecting a photomask according to the present embodiment will be described here in detail.

Figure 2:
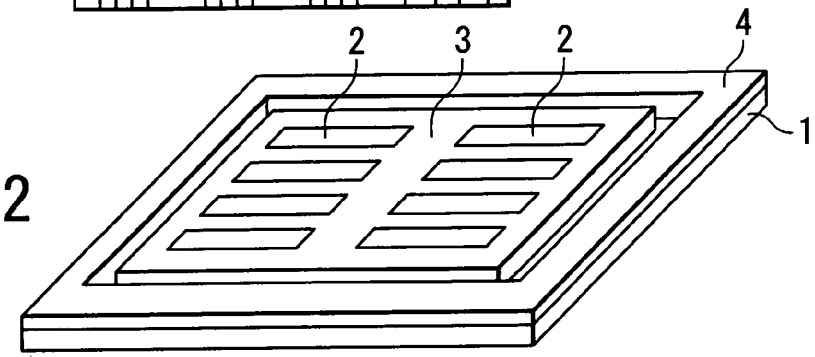
FIG. 2 is a perspective view showing the photomask.

First, a half tone photomask (KrF-HT mask) as shown in FIG. 2 is prepared. The KrF-HT mask comprises a transparent substrate 1 made of a quartz (Qz); and a mask pattern provided on the transparent substrate 1 and composed of a film (KrF-HT film) having a semi-transmission property relevant to Kr exposure light.

In FIG. 2, reference numeral 2 denotes a region (cell pattern region) in which a memory cell pattern has been formed; reference numeral 3 denotes a region (peripheral circuit pattern region) in which a peripheral circuit pattern has been formed; and reference numeral 4 denotes a KrF-HT film on the peripheral edge portion of the transparent substrate 1, which does not configure a device pattern.

Figure 3:
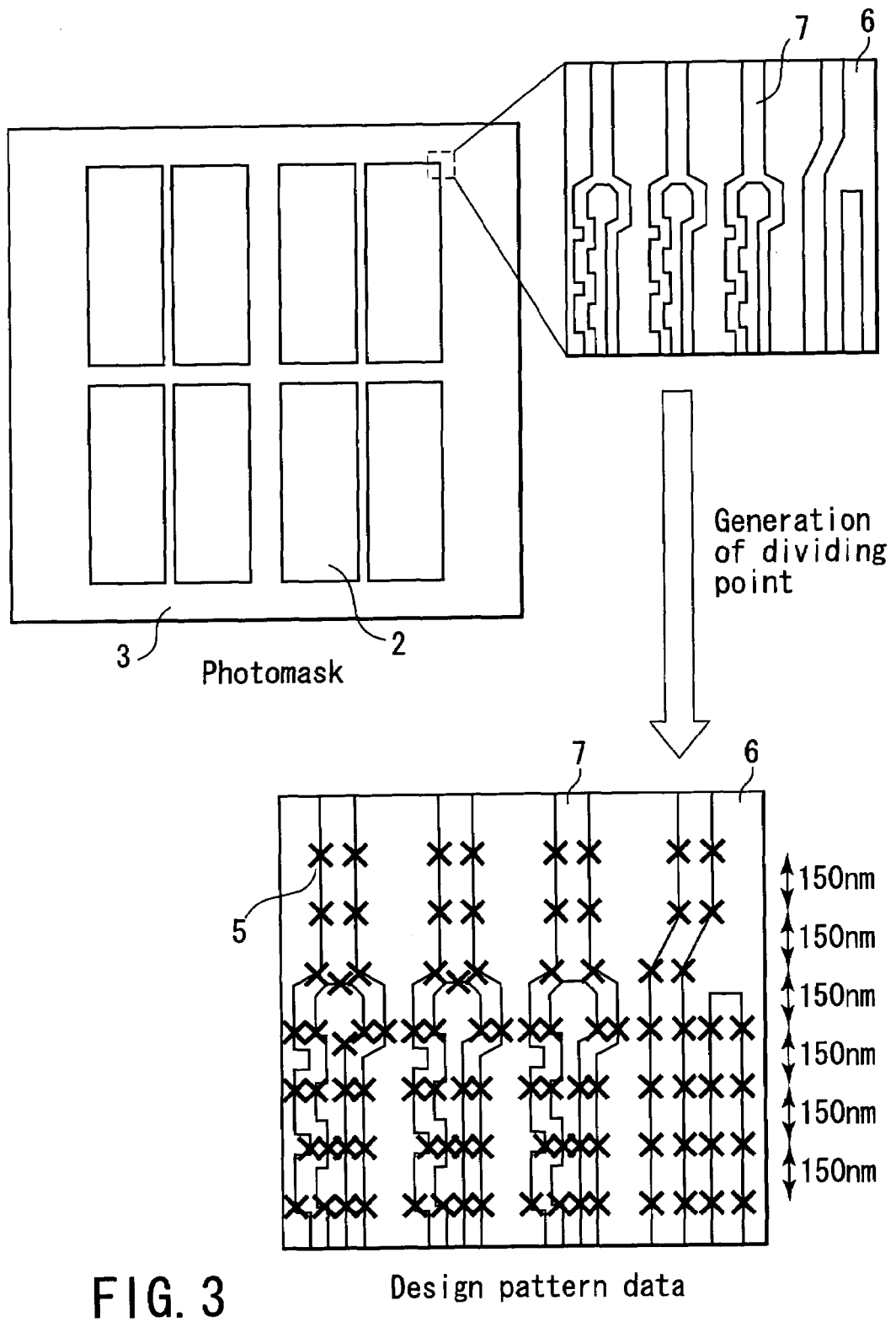
FIG. 3 is a plan view illustrating the steps of specifying a dividing point.

Next, as shown in FIG. 3, a dividing point 5 is specified in steps of 150 nm with respect to design pattern data corresponding to a pattern in a region (target region) targeted to be inspected on a photomask. In FIG. 3, reference numerals 6 and 7 denote respectively portions corresponding to the KrF-HT film (light shield region) on the transparent substrate 1 and an exposure surface (transparent region) of the transparent substrate 1 on graphic data on a design pattern.

As the dividing point 5, a portion whose size is an integer multiple of the depicted grid width of the mask depicting device or the inspected grid width of the defect inspecting apparatus is specified for design pattern data. In this manner, the dividing point 5 can be easily specified.

Figure 4:
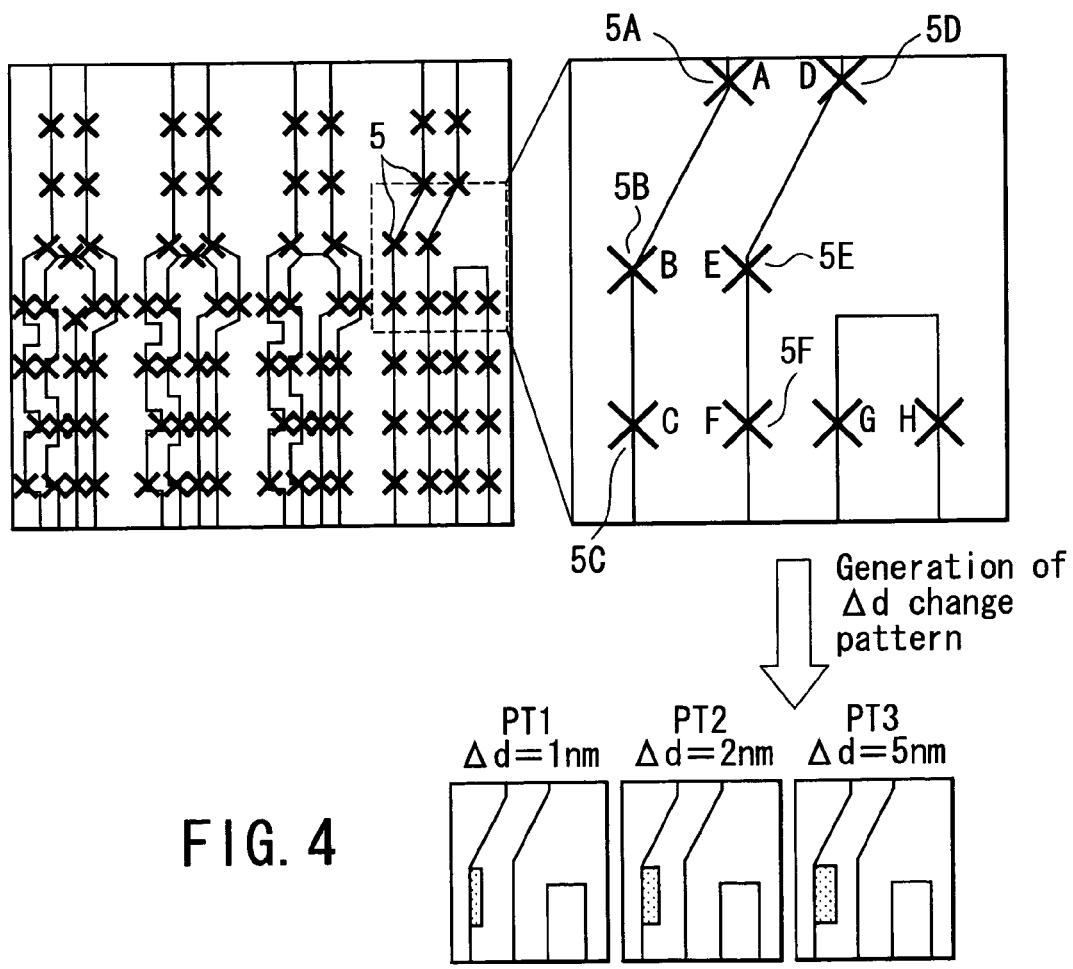
FIG. 4 is a view illustrating the steps of preparing a pattern with a changed line width Δd with respect to regions, each of which is defined at the two adjacent upper and lower dividing points.

Next, as shown in FIG. 4, a pattern whose line width has been changed by Δd=±1, ±2, ±5 [nm] is prepared for edges (edge A-B, edge B-C, edge, D-E, edge E-F, . . . ) specified by the adjacent upper and lower two dividing points 5 (points 5A and 5B, points 5B and 5C, points 5D and 5E, points 5E and 5F, . . . ). In FIG. 4, patterns PT1 to PT3 whose line width has been changed by $\Delta d=\pm 1$, $\pm 2$, $\pm 5$ [nm] are shown with respect to an edge (edge B-C) defined by dividing points 5B and 5C. In FIG. 4, although one edge of line has been selected, both edges may be selected.

The line width $\Delta d$ may be changed for all the edges defined by the dividing point 5, or the line width $\Delta d$ may be changed for a single edge. That is, at least one edge is selected, and the line width $\Delta d$ is changed. Basically, the detection precision is improved more remarkably when many more edges are selected. In the present embodiment, a description will be given, assuming that the line width $\Delta d$ is changed for all the edges.

In addition, the selected edges do not have an optical proximity effect on each other, or advantageous effect thereof is sufficiently low. Here, although the dividing point 5 has been specified in a vertical direction, a direction in which the dividing point 5 is specified is optimal.

Next, by well known exposure margin evaluation, an exposure amount Ie required for exposing a pattern of $\Delta d=0$ [nm] (defect free pattern) is acquired for edges of a control pattern (pattern used for controlling photomasks in accordance with the same design rule). Instead of the exposure amount Ie, the threshold value (Threshold) of the corresponding light intensity may be acquired.

Figure 5:
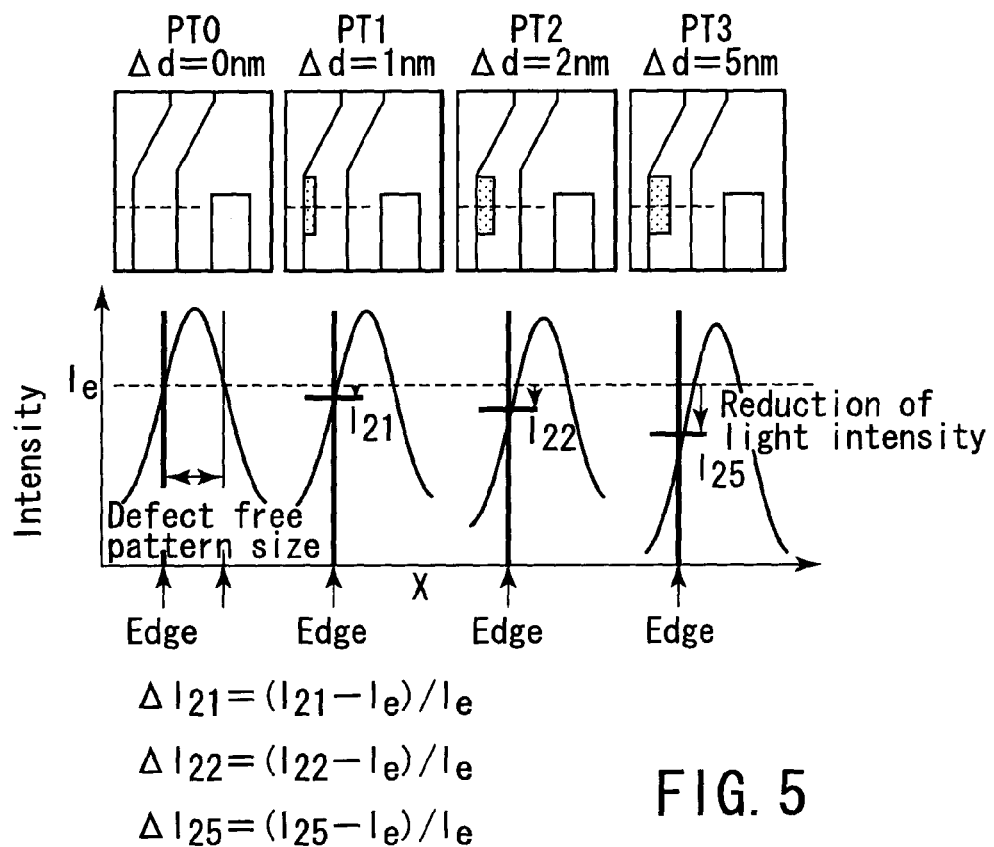
FIG. 5 is a view showing a light intensity distribution and an exposure amount variation rate with respect to a pattern (Δd=0, 1, 2, 5 [nm]) of edge B-C.

Next, with respect to a pattern changed by $\Delta d=\pm 1$, $\pm 2$, $\pm 5$ [nm] for edges A-B, B-C, . . . , in the case where a ⅔ ring band illumination of $\lambda=248$ nm, NA=0.68, $\sigma=0.75$ is used, a light intensity distribution formed at a resist on a wafer is computed. From the computed light intensity distribution, the above-described patterns each are exposed on the resist as desired, and an exposure amount $I_{ij}$ required for forming a resist pattern of its predetermined dimensions is computed. Further, a variation rate (exposure amount variation rate) $\Delta I_{ij}$ $(=(I_{ij}-Ie)/Ie)$ is acquired with respect to the exposure amount Ie. FIG. 5 shows a light intensity distribution and an exposure amount variation rate with respect to a pattern ($\Delta d=\pm 1$, $\pm 2$, $\pm 5$ [nm]) of edge B-C.

Here, "i" of $\Delta I_{ij}$ denotes an indicator corresponding to edges (edge A-B, edge B-C, edge D-E, edge E-F, . . . ). Here, edges A-B, B-C, D-E, and E-F are alphanumerically allocated in ascending order such as i=1, i=2, i=3, and i=4, respectively.

In addition "j" denotes an indicator corresponding to a line width change quantity $\Delta d$ on the mask for each edge. Here, numeric values of line width change quantities are allocated. Namely, j=1, j=2, and j=5 are allocated when $\Delta d=1$ nm, 2 nm, and 5 nm, respectively.

The exposure amount variation rate $\Delta I_{ij}$ can be acquired whenever the rate is positive or negative. When the exposure amount is lowered than Ie, the rate becomes negative, and when the quantity is increased, the rate becomes positive. If an indicator i, j is not particularly required, the indicator is simply expressed as $\Delta I$, hereinafter.

In the present embodiment, with a dimensional control pattern, the allowable dimensional variation rate of a transferred pattern (resist pattern) due to a mask defect is determined to be uniformly 8% irrespective of the dimensions of the dimensional control pattern. The allowable dimensional variation rate is given by 100×(dimensional change quantity of transferred pattern)/(design dimensions of transferred pattern).

Although there is a possibility that the allowable dimensional variation rate differs depending on each pattern dimension, a value of 8% which is recognized to be empirically effective is employed here for clarity. The allowable dimensional variation rate may be determined depending on each dimension.

When the exposure amount variation rate $\Delta Ic$ of the dimensional control pattern corresponding to the allowable dimensional variation rate of 8% is investigated, $\Delta Ic=-0.06$, and further, $\Delta d$ corresponding to $\Delta Ic=-0.06$ is 2.7 nm.

Therefore, a pattern in which $\Delta d$ corresponding to $\Delta I_{ij}=-0.06$ is greater than 2.7 nm has a smaller effect on a transferred pattern due to a mask defect than the dimensional control pattern. A pattern in which $\Delta d$ is less than 2.7 nm has a greater effect on a transferred pattern due to a mask defect than the dimensional control pattern.

From the foregoing, in the case of a pattern in which $\Delta d$ corresponding to $\Delta I_{ij}=-0.06$ is greater than 2.7 nm, the size of a mask defect to be inspected by the inspecting apparatus may be greater than the minimum detection defect size determined with respect to the dimensional control pattern. However, in the case of a pattern in which $\Delta d$ is smaller than 2.7 nm, the size of a mask defect to be inspected by the inspecting apparatus is required to be smaller than the minimum detection defect size. In the case of a pattern in which $\Delta d$ is equal to 2.7 nm, the size of a mask defect to be inspected by the inspecting apparatus may be equal to the minimum detection defect size.

Figure 6:
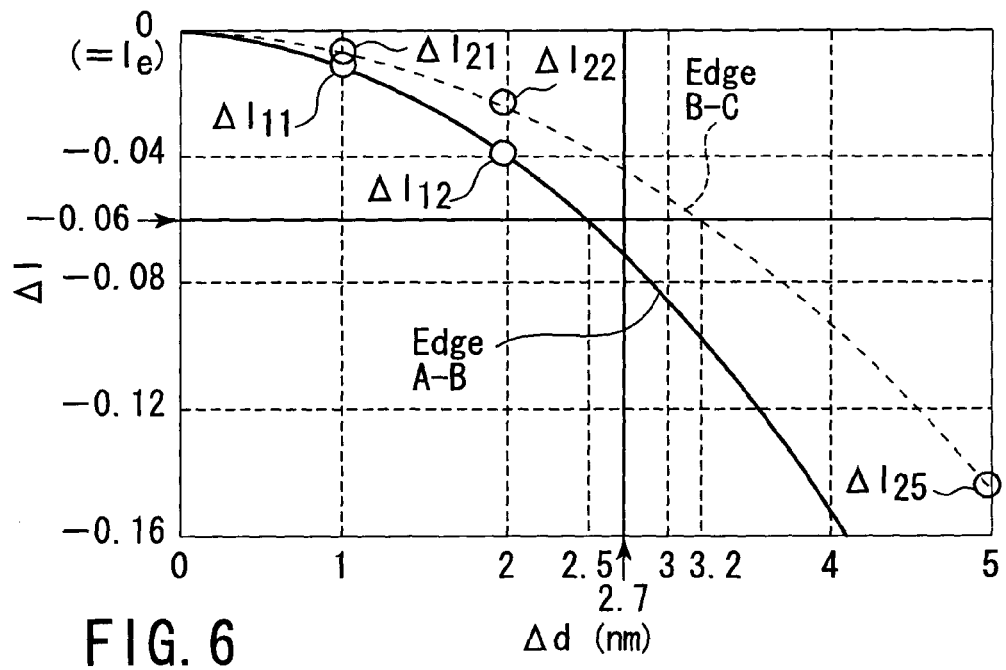
FIG. 6 is a view showing a result obtained by investigating a relationship between Δd and ΔI in edges A-B and B-C.

FIG. 6 shows a result obtained by investigating a relationship in edge A-B and edge B-C between $\Delta d$ and $\Delta I$. From FIG. 6, $\Delta d$ corresponding to exposure amount variation rate $\Delta I=0.06$ is 2.5 nm at edge A-B, and is 3.2 nm at edge B-C. It is found that the mask defect at edge A-B is great in influence relevant to a transferred pattern, and the mask defect at edge B-C is small in influence relevant to a transferred pattern. This means that, even if the detection sensitivity during inspection of edge B-C is lower than that during inspection of edge A-B, the required detection sensitivity is ensured. In this manner, edge B-C is prevented from being inspected with detection sensitivity which is severer than necessary, and detection of a pseudo defect is prevented.

Figures 7A, 7B, 8A, 8B:
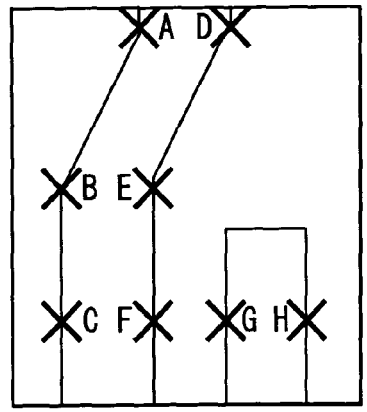
FIG. 7A and FIG. 7B are views each showing a defect influence map.
FIG. 8A and FIG. 8B are views each showing a defect influence table.

Next, the above-described $\Delta d$ is computed with respect to divided regions of a region (target region) to be inspected on a photomask. By using a relationship between a pattern position and $\Delta d$ in the target region, the indicators (detection sensitivities K to M) indicating the influence of a mask defect upon a wafer is acquired in the divided regions on the target region. Based on the indicator (detection sensitivities K to M), a defect influence map including the indicators (detection sensitivities K to M) is generated, as shown in FIG. 7A and FIG. 7B. The defect influence map may be in the form of table such that the divided regions on the target region and the detection sensitivities K to M each are associated with each other, as shown in FIG. 8A and FIG. 8B.

For the divided region corresponding to a portion other than edges, for example, the same indicator as the most proximal edge is employed with respect to a horizontal direction (X coordinate). When a distance up to the left edge is equal to a distance up to the right edge and the indicators are different from each other depending on the left and right edges, either of these indicators is employed.

In addition, the detection sensitivity of a black defect is changed at the edge of $\Delta d=2.7$ nm. Specifically, with respect to a pattern of $\Delta d=2.7$ nm, a pattern of 130 nm□ or more is defected as a black defect. With respect to a pattern of $\Delta d>2.7$ nm, a pattern of 180 nm□ or more is detected as a opaque defect.

On the other hand, the detection sensitivity of a white defect is changed at the edge of Δd=3.5 nm. Specifically, with respect to a pattern of Δd=3.5 nm, a pattern of 180 nm□ or more is defected as a white defect. With respect to a pattern of Δd>3.5 nm, a pattern of 220 nm□ or more is detected as a clear defect.

Δd defined as a reference differs depending on a opaque defect and a clear defect because one influence on a transferred pattern differs from another depending on the opaque and clear defects.

The detection sensitivities K to N are four patterns obtained by combining the detection sensitivities of the above opaque and clear defects. Specifically, (opaque, clear) =K (130, 180), L (130, 220), M (180, 180), N (180, 220)nm□ is obtained.

Next, reference is made to a relationship between each divided region on the target region and each of the detection sensitivities K to N. Each divided region is inspected based on any of the detection sensitivities K to N, and the presence or absence of a defect on a photomask is detected.

Inspection of a photomask using the above-described detection sensitivity is carried out in accordance with die-to-data base comparative inspection, for example. That is, by using a comparator circuit, sensor data and reference data are compared with each other, and if a difference in level is equal to or greater than a predetermined value (threshold value), it is detected as a defect. The comparator circuit is composed of, for example, a differential circuit. The above-described threshold value is basically determined to be higher as the detection sensitivities K to N are lower. In this manner, it becomes possible to decrease a mask defect detected as a pseudo defect.

Figure 9A:
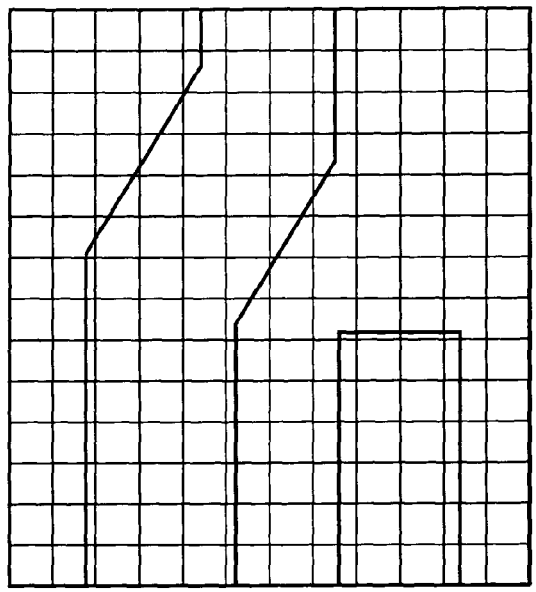
FIG. 9A and FIG. 9B are views each showing an example of reference data and sensor data in a comparator circuit using the defect influence map.
Figure 9B:
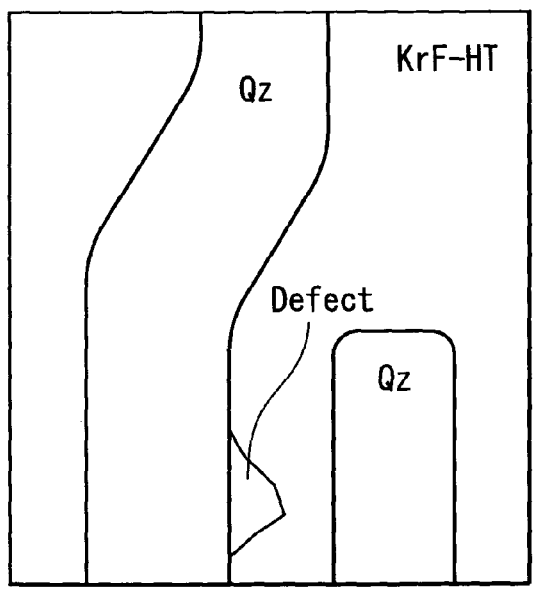

FIG. 9A and FIG. 9B each show an example of reference data and sensor data in a comparator circuit using a defect influence map according to the present embodiment. This example is directed to the regions shown in FIG. 8A and FIG. 8B.

Reference data, as shown in FIG. 9A, is composed of data (256 gradations) obtained when the light intensity of graphic data in each divided region has been multi-valued. The actually used reference data may be used as data considering corner rounding processing and resize processing corresponding to a mask process. On the other hand, the sensor data, as shown in FIG. 9B, is composed of actually measured values (256 gradations) of the light intensity of each divided region obtained from actual photomask inspection light.

Figures 10, 11, 12:
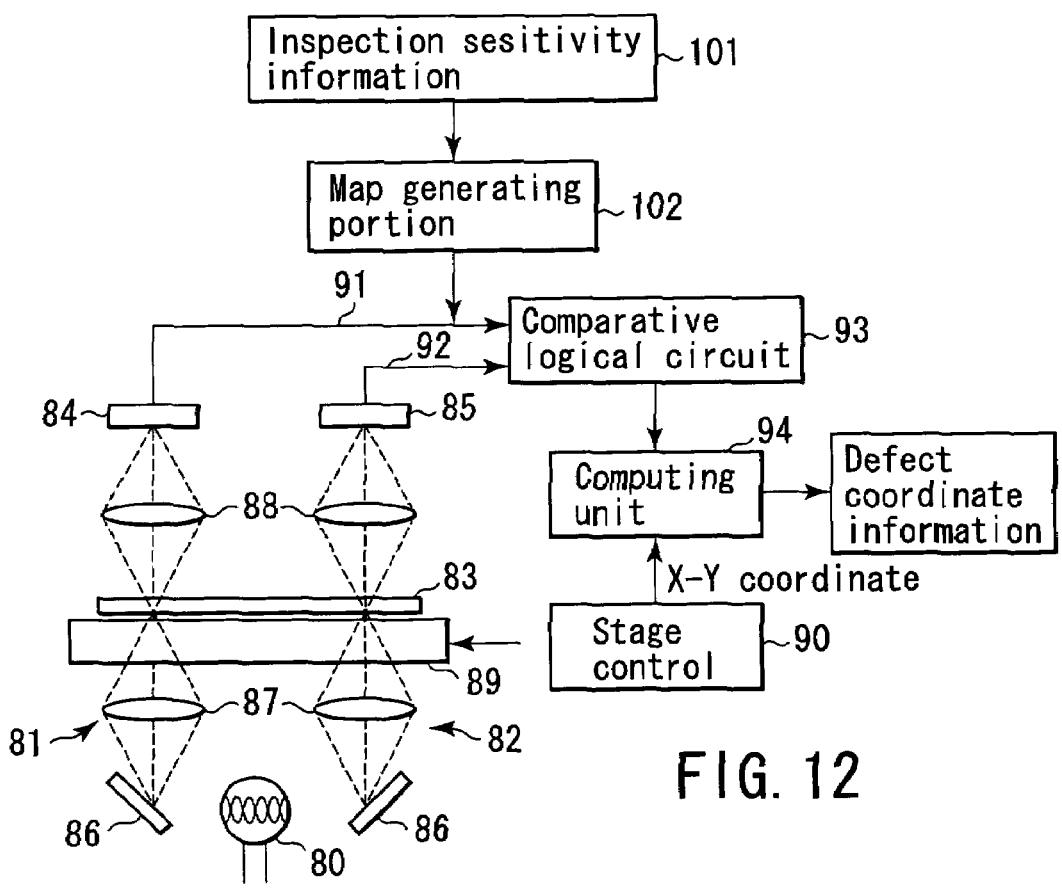
FIG. 10 is a view showing a result (a difference in level) of comparison between the reference data and the sensor data in the comparator circuit using the defect influence map.
FIG. 11 is a view showing an example of threshold values.
FIG. 12 is a schematic diagram depicting a defect inspecting apparatus for carrying out die-to-data base comparative inspection of the first embodiment.

FIG. 10 shows a result (difference in level) of comparison between the reference data and the sensor data in the comparator circuit using the defect influence map according to the present embodiment. This example is directed to the regions shown in FIG. 8A and FIG. 8B. In addition, FIG. 11 shows an example of threshold values. The threshold value is obtained as an average value between the threshold value corresponding to a opaque defect and the threshold value corresponding to a clear defect.

As shown in FIG. 10, it is determined whether or not a difference in level between the sensor data and the reference data in the region shown in FIG. 8 exceeds the threshold value. A divided region in which it is determined that the above-described difference in level exceeds the threshold value is recognized as a defect. In the case of FIG. 10, no defect is recognized.

Figure 22:
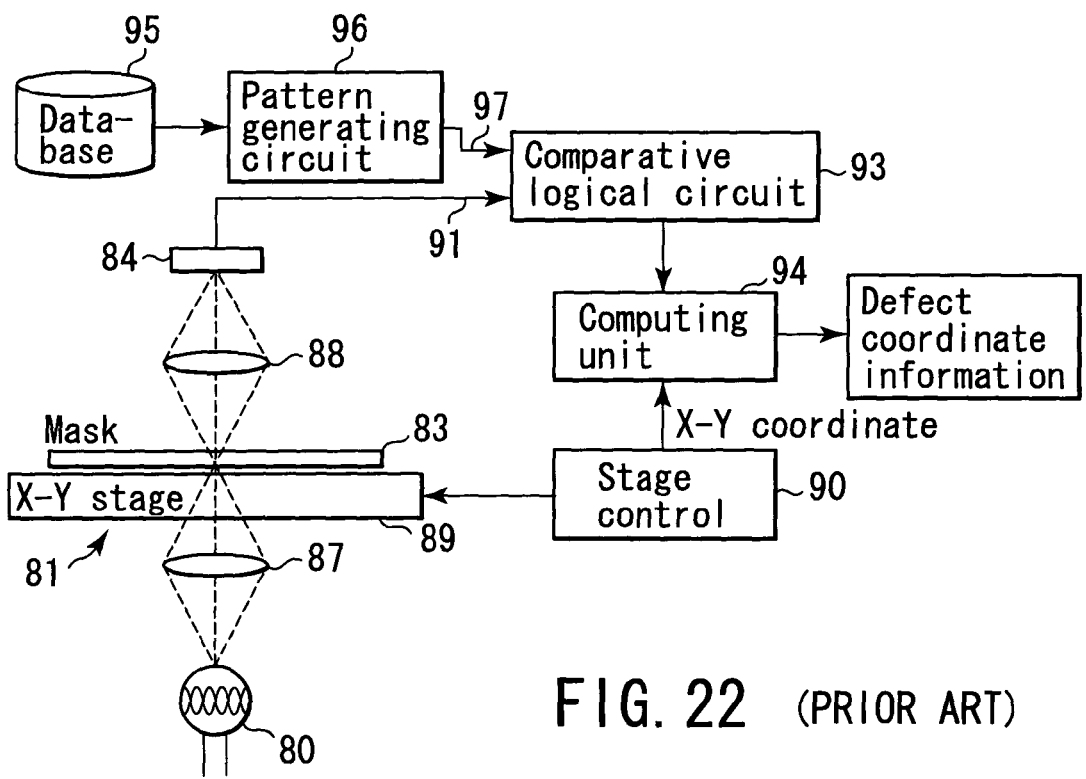
FIG. 22 is a schematic diagram depicting a conventional defect inspecting apparatus for use in a die-to-data base comparative inspecting technique.

FIG. 12 is a schematic diagram depicting a defect inspecting apparatus for carrying out die-to-data base comparative inspection according to the present embodiment. Like elements corresponding to those of a conventional defect inspecting apparatus shown in FIG. 22 are designated by like reference numerals. A detailed description is omitted here.

A difference from the conventional defect inspecting apparatus shown in FIG. 22 is that there is provided a map generating portion 102 for inputting detection sensitivity information 101 including information on the coordinate and detection sensitivities (K to M) of each region on a photomask.

As has been described above, according to the present embodiment, detection of a pseudo defect is prevented by considering an effect of a mask defect upon a transferred pattern. In this manner, reduction of a photomask or semiconductor device manufacturing period can be ensured, and further, cost reduction can be ensured. In addition, a mask defect which has a great effect on a transferred pattern is detected with high sensitivity. This leads to reduction of a manufacturing period and cost reduction. Further, there is no need to make discrimination between a mask defect which does not have an effect on a transferred pattern and a mask defect which has an effect thereon after acquiring the inspection result. This leads to reduction of a manufacturing period and cost reduction.

In the present embodiment, although a description has been given with respect to a case of a half tone mask for use in KrF exposure, the present embodiment can be applied to another half tone mask for use in ArF exposure, $F_2$ exposure, EUV exposure and the like. Further, the present invention can be applied to a mask other than a half tone mask, for example, a Levenson mask, a COG mask and the like. Furthermore, the present embodiment can be applied to a mask for use in non-optical system exposure such as EB stepper or X-ray.

In the present embodiment, a description has been given with respect to a case of using the die-to-data base comparative inspecting technique. However, there may be used another comparative inspecting method such as a die-to-die comparative inspecting technique for inputting information on a defect influence map in the format of a coordinate system, the method being carried out by using the information.

Figure 21:
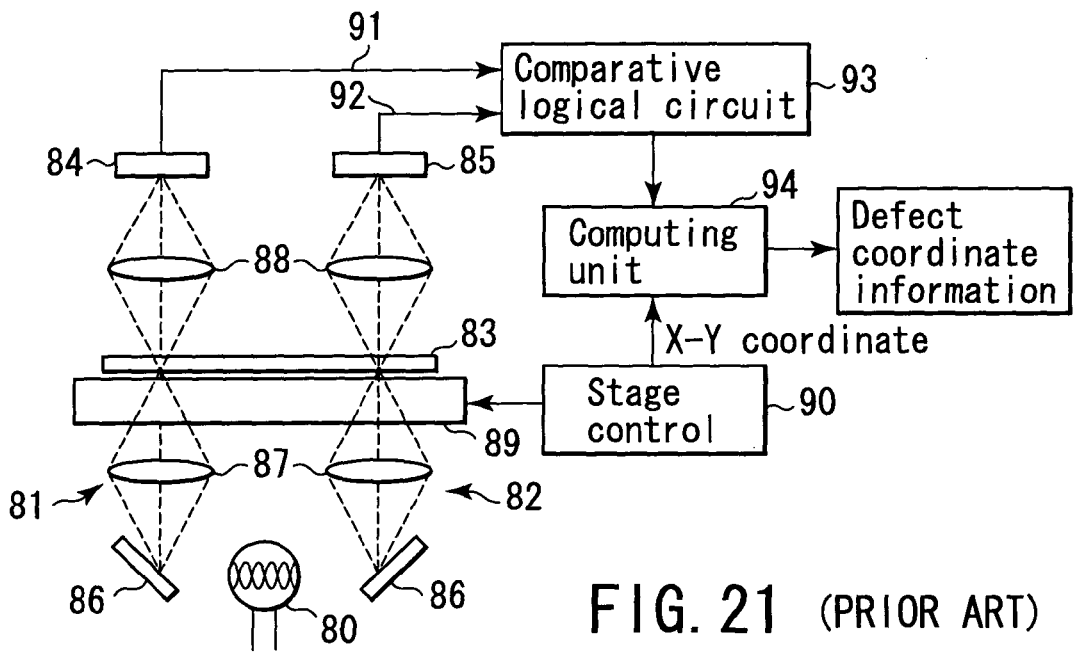
FIG. 21 is a schematic diagram depicting a conventional defect inspecting apparatus for use in a die-to-die comparative inspecting technique.

FIG. 13 is a schematic diagram depicting a defect inspecting apparatus for carrying out die-to-die comparative inspection. Like elements corresponding to those of the defect inspecting apparatus shown in FIG. 21 and FIG. 12 are designated by like reference numerals shown in FIG. 21 and FIG. 12. A detailed description is omitted here.

Moreover, in the present embodiment, a description has been given with respect to a case where an effect of a mask defect upon a wafer is investigated by using the exposure amount variation rate $\Delta I_{ij}$ obtained by changing the line width variation (change quantity) Δd on a photomask, and the detection sensitivity (threshold value) is determined based on this influence upon the wafer. However, the detection sensitivity may be determined by using a technique for investigating the influence of the other mask defect upon a wafer.

For example, the influence of a mask defect upon a wafer is investigated by using the dimensional variation rate of a pattern (resist pattern) transferred onto a resist on a wafer obtained by changing the line width change quantity Δd with respect to the entire mask pattern on a photomask, and the detection sensitivity may be determined based on this influence upon the wafer.

As another method, there is exemplified applying the method disclosed in Jpn. Pat. Appln. KOKAI Publication No. 2000-098584. That is, an influence of a mask defect upon a wafer is investigated by using the exposure amount variation rate with respect to portions of a resist pattern obtained by changing the line width of the entire pattern, and the detection sensitivity may be obtained based on this influence upon the wafer.

In addition, in the present embodiment, each portion of the entire pattern is divided, whereby the defect influence map is generated, and inspection is carried out based on the defect influence map. However, a pattern is divided into two ways, i.e., a cell portion including a pattern of size which is equal to that in design rule and a peripheral circuit portion including a pattern of size which is greater than that formed in the cell portion, two defect influence maps are defined at the cell portion and the peripheral circuit portion (defect influence maps are generated in a broad sense), whereby inspection may be carried out.

Second Embodiment

The second embodiment of the invention is different from the first embodiment in that a defect influence map is generated by using the influence of a mask defect upon device operation.

First, as in the first embodiment, the KrF-HT mask shown in FIG. 2 is prepared, and then, the dividing point 5 is specified in steps of 150 nm, as shown in FIG. 3.

Next, as shown in FIG. 14A and FIG. 14B, with respect to segments (segment A-D, segment B-E, segment C-F, . . . ) defined by the adjacent two dividing points 5, the line width variation rate (allowable line width variation rate) of a pattern (wafer pattern) of a photomask transferred to a resist on a wafer, corresponding to a boundary relevant to the presence or absence of the influence upon device operation, is acquired.

The allowable line width variation rate is given by 100× (line width change quantity of wafer pattern which influences device operation)/(design dimensions of wafer pattern). The device operation used here denotes each operation concerning a device to be generally checked, the device causing a leak current when a gate is turned OFF, for example, or having an effect on device operation such as the possibility of correct write and readout operations.

Figure 15:
FIG. 15 is a view illustrating the steps of converting the allowable line width variation rate in each segment into an exposure amount variation rate.

Next, assume that changing the dimensions of segments such as segment A-D and segment B-E corresponds to changing the line width $\Delta d$ at edge A-D, edge B or the like. As shown in FIG. 15, the allowable line width variation rate in each segment is converted into the exposure amount variation rate $\Delta I$ by using the results of simulation and testing, for example. The exposure amount variation rate $\Delta I$ is defined as in the first embodiment. In addition, this variation rate may be converted into a variation rate of the light intensity corresponding to the exposure amount variation rate $\Delta I$.

Also, in the present embodiment, as in the first embodiment, the allowable dimensional variation rate of the dimensional control pattern is 8%; the exposure amount variation rate corresponding to the allowable dimensional variation rate is 0.06; and further, $\Delta d$ corresponding to the $\Delta I$ is 2.7 nm.

$\Delta d$ corresponding to $\Delta I$ of edge A-B in FIG. 15 is greater than 2.7 nm from FIG. 6. Similarly, $\Delta d$ corresponding to $\Delta I$ of edge B-C in FIG. 15 as well is greater than 2.7 nm.

Therefore, the portions corresponding to segments A-D and B-E has a smaller effect of a mask defect upon device operation than the dimensional control pattern. Thus, the size of a mask defect to be inspected by the inspecting apparatus may be greater than the minimum detection defect size determined with respect to the dimensional control pattern.

Conversely, a portion at which $\Delta d$ corresponding to $\Delta I$ is equal to or smaller than 2.7 nm has a greater effect of a mask defect upon device operation than the dimensional control pattern. Thus, the size of a mask defect to be inspected by the inspecting apparatus is required to be smaller than the minimum detection defect size.

Figure 16:
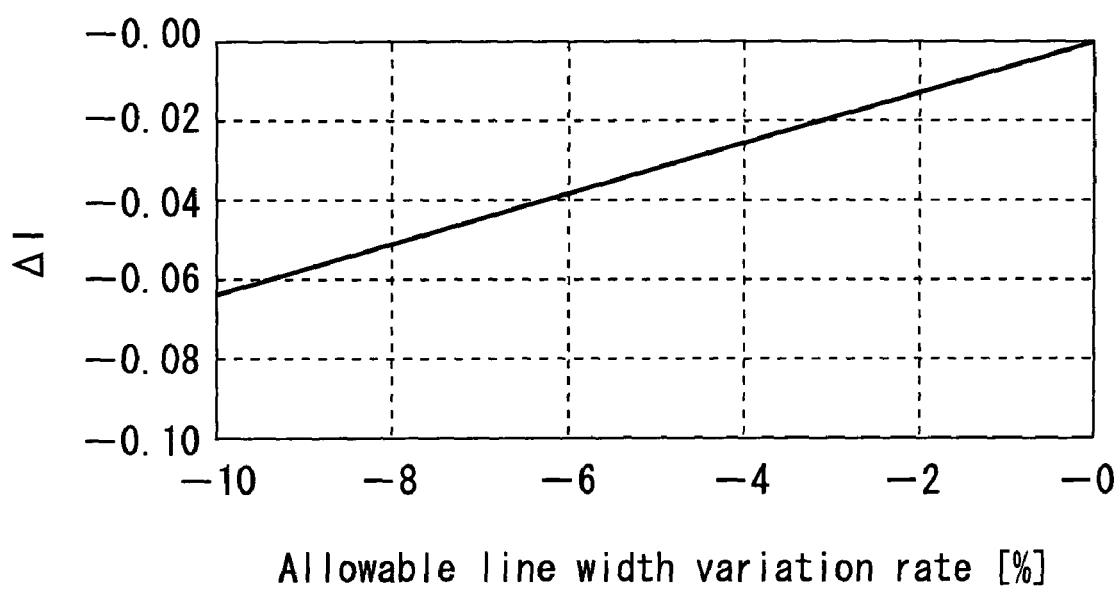
FIG. 16 is a graph depicting the exposure amount variation rate with respect to each segment in a target region.

Next, the allowable width variation rate and exposure amount variation rate $\Delta I$ in each segment in a target region are obtained. As shown in FIG. 16, a relationship between the allowable line width variation rate and the exposure amount variation rate $\Delta I$ is depicted in a graph (or in a table) by means of interpolation. Then, the indicators (detection sensitivities K to M used here) indicating the influence of a mask defect upon a wafer is acquired in each divided region on the target region. Based on the indicators (detection sensitivities K to M) in each divided region, a defect influence map including the indicators (detection sensitivities K to M) is formed as shown in FIG. 17A and FIG. 17B. The defect influence map may be in the form of table such that the divided regions on the target region are associated with the detection sensitivities K to M.

The same indicator as a segment which is the most proximal with respect to a vertical direction (Y coordinate) is employed for the divided region corresponding to a portion other than segments. When a distance up to an upper segment is equal to a distance up to a lower segment and the indicators differ depending on the upper segment and the lower segment, either of these indicators is employed. In addition, the same indicator is employed for a divided region on the same segment on which a position in a vertical direction (Y coordinate) is identical to another, and a position in a horizontal direction (X direction) is different from another.

The detection sensitivity of a black defect is changed at the edge of $\Delta d=2.7$. Specifically, with respect to a pattern of $\Delta d$ equal to or smaller than 2.7 nm, a pattern of 130 nm$^\square$ or more is detected as a opaque defect, and with respect to a pattern of $\Delta d$ larger than 2.7, a pattern of 180 nm$^\square$ or more is detected as a opaque defect. On the other hand, the detection sensitivity of a clear defect is changed at the edge of $\Delta d=3.5$ nm. Specifically, with respect to a pattern of $\Delta d$ equal to or smaller than 3.5 nm, a pattern of 180 nm$^\square$ or more is detected as a clear defect. With a pattern of $\Delta d$ larger than 3.5 nm, a pattern of 220 nm$^\square$ or more is detected as a clear defect.

The detection sensitivities are four patterns obtained by combining the detection sensitivities of opaque and clear defects. Specifically, (opaque, clear)=K (130, 180), L (130, 220), M (180, 180), N (180, 220)nm$^\square$ is obtained.

Next, as in the first embodiment, inspection of the presence or absence of a defect is carried out with any of the detection sensitivities K to N in the divided regions on the target region. This inspection as well, as in the first embodiment, for example, is carried out by using the die-to-database comparative inspecting method and apparatus or die-to-die comparative inspecting method and apparatus.

Figures 19, 20:
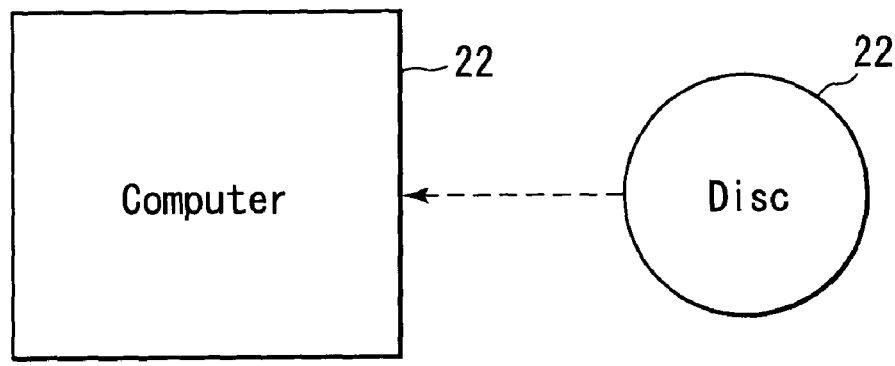
FIG. 19 is a view showing a result (a difference in level) of comparison between the reference data and the sensor data in the comparator circuit using the defect influence map.
FIG. 20 is a view illustrating a computer program product according to the third embodiment.

FIG. 18A and FIG. 18B are views each corresponding to the multi-valued data and sensor data shown in FIG. 9A and FIG. 9B. FIG. 19 is a view each corresponding to a result of comparison between the reference data and the sensor data shown in FIG. 10. The threshold value is equal to that shown in FIG. 11. From FIG. 19, in the case of the present embodiment, it is found that a defect has been detected at a portion at which no defect has been detected in the first embodiment.

As has been described above, detection of a pseudo defect is prevented by taking into consideration an effect of a mask defect upon device operation. In this manner, reduction of a photomask or semiconductor device manufacturing period can be ensured, and further, cost reduction can be ensured. In addition, since a defect at a portion which has a small effect on device operation is detected as a defect, a defect which is unnecessary to correct and which does not have an effect on device operation is not corrected in the correcting steps. This also leads to reduction of a manufacturing period and cost reduction. Also in the present embodiment, a variety of corrections described in the first embodiment can occur.

In the above-described embodiments, a description has been given with respect to a case where a defect influence map is generated by using the influence on a transferred pattern and the influence on device operation as the influence of a mask defect upon a wafer. However, the defect influence map may be generated by using the influence of a mask defect on the device yield. In this case, for example, the exposure amount variation rate $\Delta Ic$ of a dimensional control pattern corresponding to a predetermined allowable device yield and the corresponding $\Delta d$ are investigated, and a defect influence map is generated.

In addition, the above embodied inspecting method or a method for generating a defect influence map can be carried out as a computer program product having recorded therein a program to be executed by a computer. The computer program products include disks such as CD-ROM and DVD, for example (third embodiment).

Specifically, as shown in FIG. 20, a disk 21 is configured to store program instructions for execution on a computer system enabling the computer system 22 to perform inputting detection sensitivities of defects on a plurality of portions of a mask pattern on a photomask, the detection sensitivities being determined according to influences of the defects upon a wafer; and inspecting defects on the plurality of portions based on the detection sensitivities. Further, a variety of specific steps in the above-described inspecting method may be executed as procedures.

On the other hand, in the case of a defect influence map, a disk 21 is configured to store program instructions for execution on a computer system enabling the computer system 22 to perform preparing detection sensitivities of defects on a plurality of portions of a mask pattern on a photomask, the detection sensitivities being determined according to influences of the defects upon a wafer; and generating an influence map including the influences of the defects upon the wafer based on the detection sensitivities of the defects. Further, a variety of specific steps in the above-described map generating method may be executed as procedures.

Figure 23:
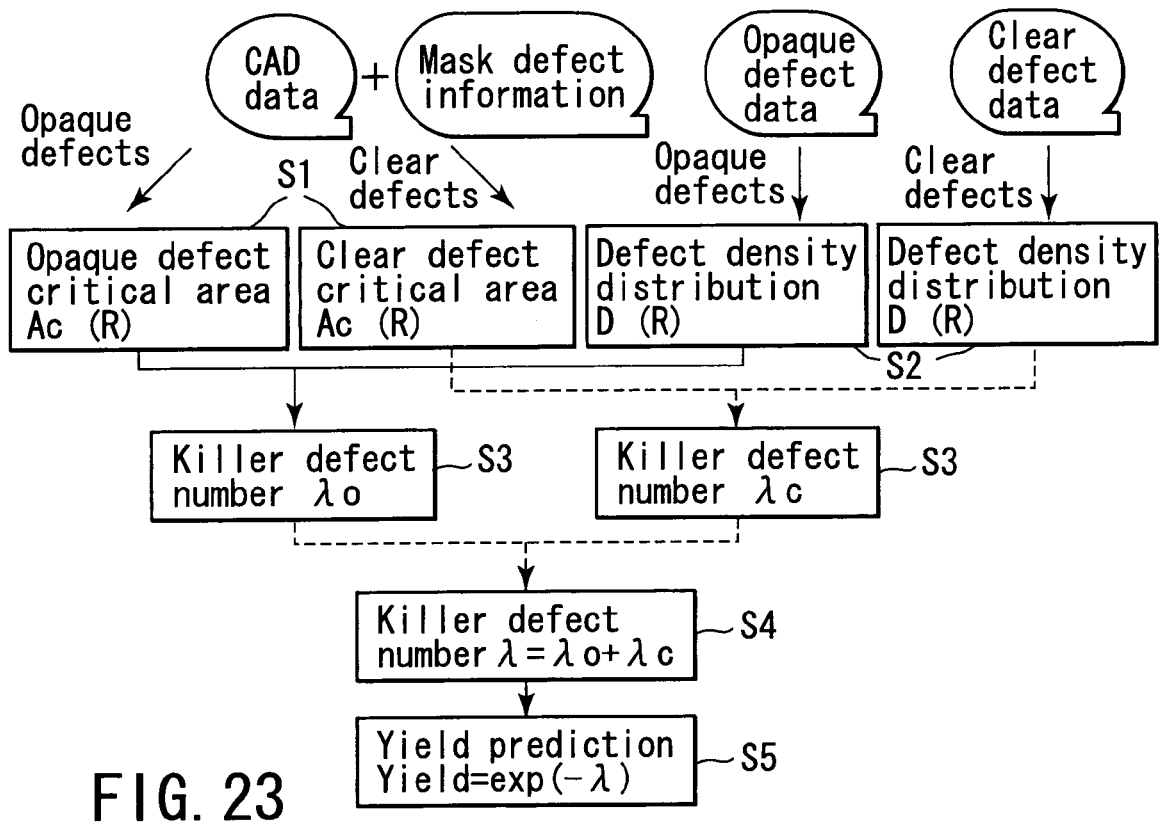
FIG. 23 is a basic conceptual diagram showing a method for predicting the yield of photomasks according to the third embodiment.
Figure 24:
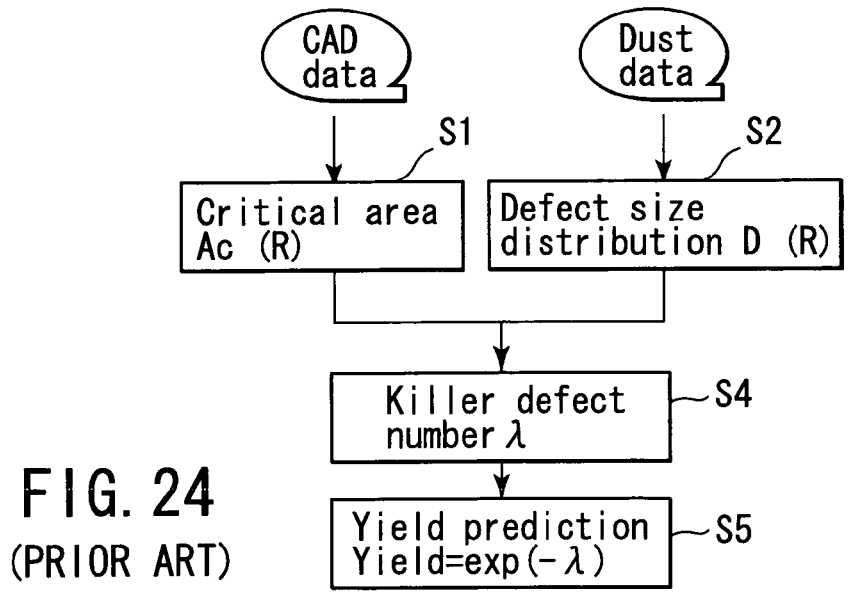
FIG. 24 is a basic conceptual diagram showing a conventional method for predicting the yield of wafers.

FIG. 23 shows a basic concept of a method for predicting the yield of a photomasks embodied according to the present invention. In addition, FIG. 24 shows a basic concept of a method for predicting the yield of wafers described in the prior art section for comparison. In FIG. 24, like elements corresponding to those in FIG. 23 are designated by like reference numerals in FIG. 23.

First, data (pattern data considering defects) which reflects mask defect information on design pattern data is generated from design pattern data of a photomask in CAD data and defect inspection information (mask defect information) used when the defect on the photomask is inspected.

Then, critical area Ac (R) is computed separately with respect to the black defect and white defect of each size (radius R) based on the generated data (step S1).

The mask defect information include mask defect specification and the influence of a mask defect upon a transferred pattern on a wafer or device operation.

Before and after or at the same time as step S1, based on black defect data and white defect data, the defect density distribution D (R) relevant to the defect sizes on a photomask is estimated separately with respect to the black defect and white defect (step S2).

Next, by estimating a black defect critical area and a opaque defect density distribution, the killer defect number $\lambda_O$ of the black defects is computed; and, by estimating a clear defect critical area and a white defect density distribution, the killer defect number $\lambda_C$ of clear defects is computed (step S3). Further, by adding the killer defect number $\lambda_O$ and the killer defect number $\lambda_C$ to each other, a total killer defect number $\lambda$ is computed.

Next, the killer defect number $\lambda$ is applied to a formula yield=exp(-$\lambda$), and yield computation is carried out, whereby the yield of photomasks is predicted (step S4). As the yield value increases, it can be predicted that the yield increases.

In this way, mask defect information is taken into consideration and critical area analysis is carried out separately with respect to the opaque defect and clear defect, whereby a practical method for predicting the yield of photomasks is achieved.

Further, evaluation other than yield evaluation can be carried out by using the yield value. For example, the cost required for the defect correcting steps or a photomask generation period can be evaluated. That is, a photomask with its small yield value can be evaluated to be costly in defect correcting steps in order to ship the mask as a good product. In addition, such a photomask with its small yield value requires a time for the defect correcting steps in order to ship the mask as a good product, and thus, the photomask generation period can be evaluated to be extended.

Fourth Embodiment

In a method for predicting the yield of photomasks according to the fourth embodiment of the invention, when critical area analysis is applied to prediction of the yield of photomasks, the size of a defect to be detected on a photomask is used, the size being determined in accordance with the mask defect specification which is one item of mask defect information, namely, in accordance with each design rule (here, one size is determined for each design rule). In addition, critical areas or the like are computed separately with respect to the opaque defect and clear defect.

First, as shown in FIG. 25, design pattern data (GDS data) 1 on a circuit layout is prepared. Design pattern data 1 is included in CAD data. The mask defect specification is prepared for each design rule. In a 0.175 micron rule device for use in the present embodiment, 150 nm$^\square$ and 160 nm$^\square$ are uniformly determined for the opaque defect and clear e defect, respectively. A mask defect which is smaller than these values is not detected by the inspecting apparatus. This makes it possible to reduce the number of pseudo defects detected on a photomask. The pseudo defect used here denotes a defect which is not essentially judged as a mask defect, but which is detected as a mask defect.

Next, as shown in FIG. 26A and FIG. 26B, the design pattern data 1 is corrected (deformed) based on the mask defect specification. That is, with respect to the design pattern data 1, the edges at both ends of a line on which a black defect exists are thickened by a quantity corresponding to the mask defect specification ΔL=150 nm□, respectively. On the other hand, the edges at both ends of a line on which a clear defect exists are thinned by a quantity corresponding to the mask defect specification ΔL=160 nm□, respectively. In this way, in the present embodiment, with respect to design pattern data 1, resize considering the mask defect specification is carried out separately for the opaque defect and clear defect. A line on which a opaque defect and a clear defect exist is thickened by a quantity corresponding to ΔL=150 nm□, or is thinned by a quantity corresponding to ΔL=160 nm□, respectively.

Hereinafter, design pattern data 1 resized considering the mask defect specification for the opaque and clear defects is referred to as pattern data considering opaque defects and pattern data considering clear defects, respectively.

Figures 27A, 27B:
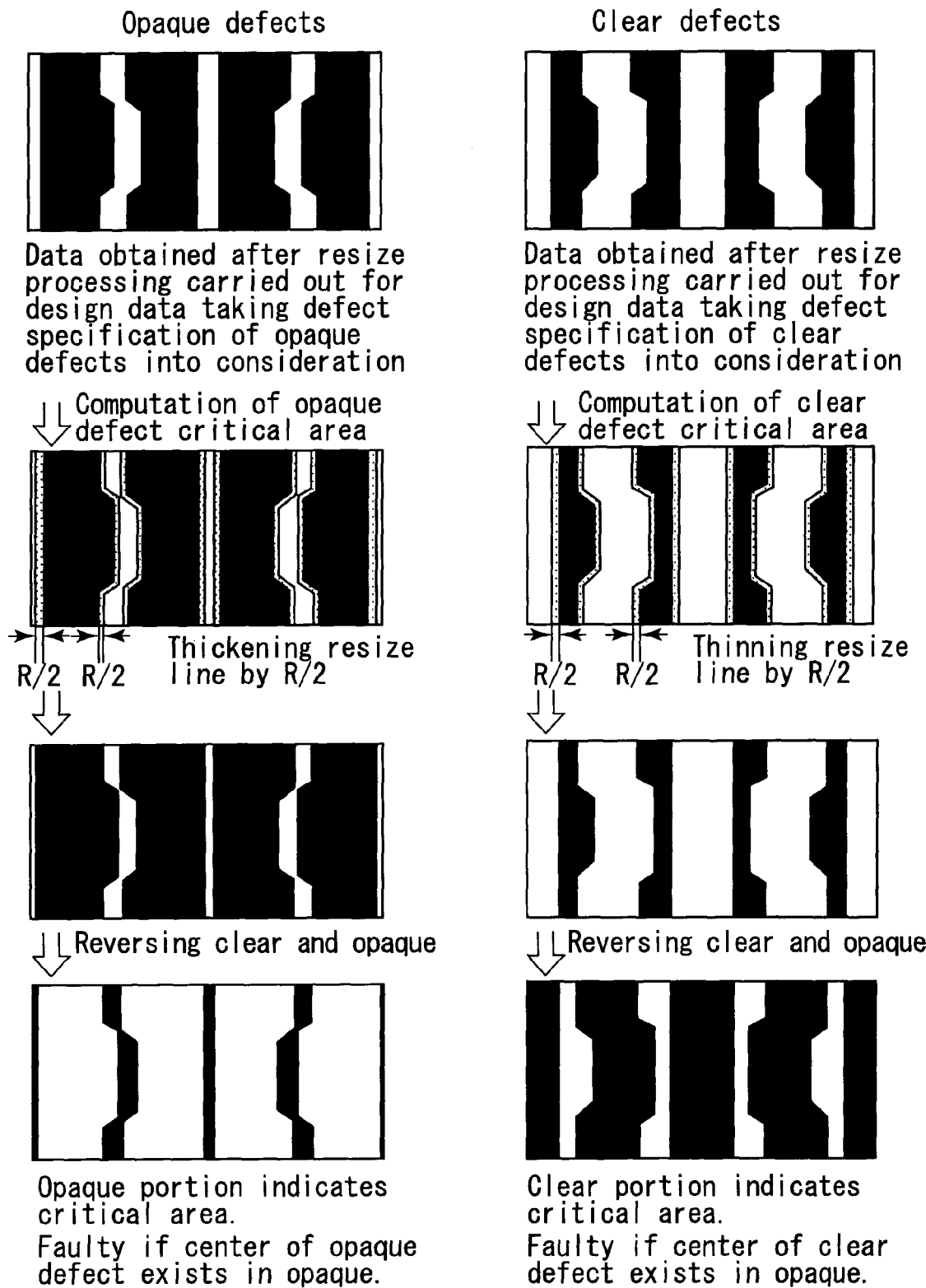
FIG. 27A and FIG. 27B are views each showing the steps of (procedures for) acquiring a critical area for black and white defects separately based on the design pattern data shown in FIG. 26A and FIG. 26B.

Next, as shown in FIG. 27A and FIG. 27B, with respect to pattern data considering opaque defects and pattern data considering clear defects, a critical area for opaque and clear defects corresponding to sizes of radium R=0, 50, 75, 100, 125, 150, 175, 200, 225, 250, 275, 300 nm□ is obtained on a photomask in accordance with a geometry technique. A critical area for defect sizes other than R=0, 50, . . . , 300 nm is obtained by means of interpolation, for example. In this manner, a critical area distribution is obtained (hereinafter, this area is expressed as critical area Ac (R).).

The critical area distribution according to the present embodiment relates to a photomask. This critical area is obtained as a distribution relevant to a relationship between the size of defect (opaque defect or clear defect) on the pattern when a defect (opaque defect or clear defect) is virtually provided on the pattern defined by pattern data considering defects (pattern data considering opaque defects and pattern data considering clear defects); and a minimum square area of a region in which a fault is generated on the pattern if the center of a defect (opaque defect or clear defect) of the size has existed.

Figure 37A:
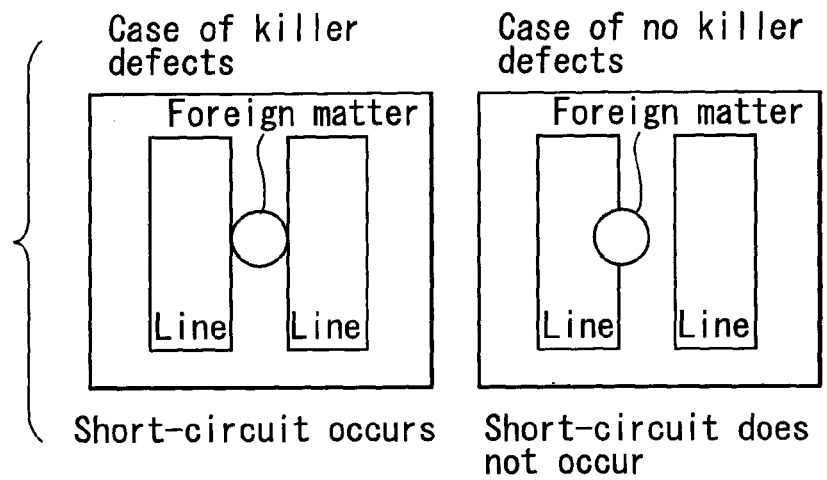
FIG. 37A to FIG. 37C are conceptual views each showing a killer defect and a critical area.
Figure 37B:
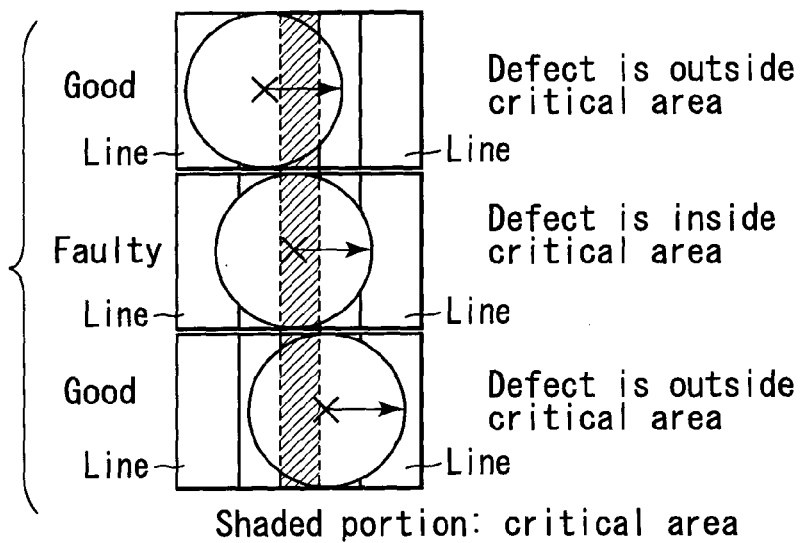
Figure 37C:
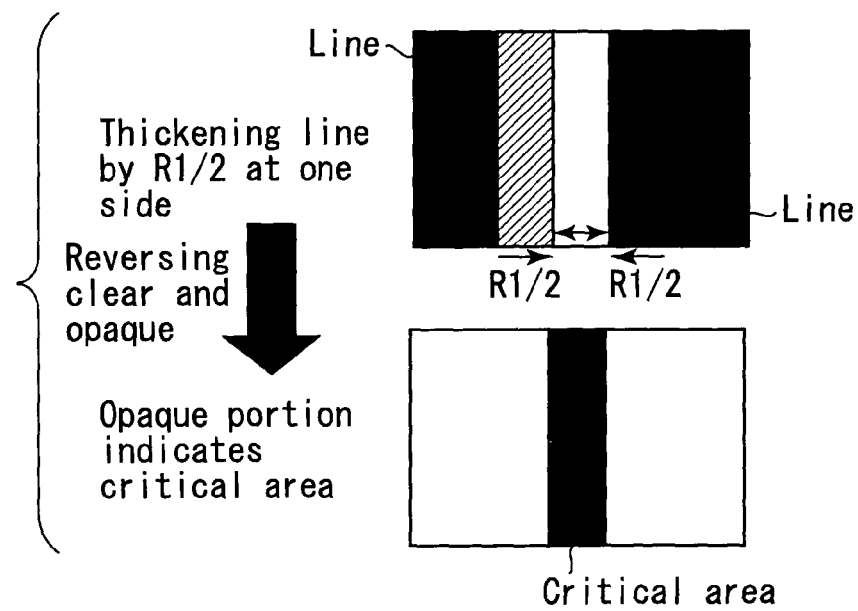

The critical area relevant to opaque defects is computed in accordance with a technique which is similar to the conventional critical area shown in FIG. 37A to FIG. 37C. In addition, the critical area relevant to white defects is computed in the same manner as that in the conventional critical area by replacing the wiring (line) and foreign matter of FIG. 37A to FIG. 37C with a space.

Next, based on data concerning the size of a defect on a photomask, obtained from a database on the defect correcting steps of the immediately preceding generation and the number of defects in each size per unit square area on a photomask (black defect data or white defect data), the defect density distribution D (R) relevant to the number of defects per unit square area on the photomask for the size of a defect on the photomask is acquired separately with respect to the black defect and the white defect.

If a database on the defect correcting steps of the current generation exists, such a database may be used instead of the database on the defect correcting steps of the immediately preceding generation. Further, the database on the defect correcting steps of the immediately preceding generation and that of the current generation may be used together.

Next, using Ac (R) and D (R) corresponding to the opaque and clear defects, the number of mask defects (killer defect number) considered to have an effect on a wafer can be obtained by means of computation relevant to each of the opaque and clear defects in accordance with the following definition.

Killer defect number=∫Ac(R)D(R)dR

The killer defect number used here denotes the number of defects on a photomask considered to produce a defect on a wafer.

Figure 28:
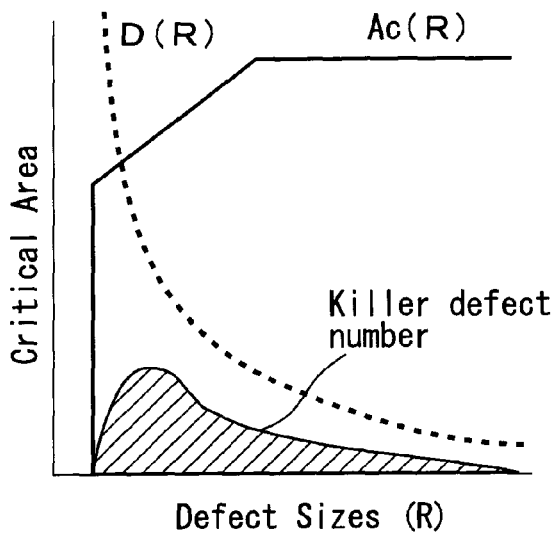
FIG. 28 is a view schematically depicting a relationship in defect density distribution between the number of killer defects and the critical area.

FIG. 28 schematically shows a relationship of killer defect number, critical area Ac (R), and defect density D (R).

Next, based on the database on the defect correcting steps of the immediately preceding generation, information on how well correction can be carried out relevant to defects to be corrected is acquired for opaque and clear defects, respectively. At this time, the database on the defect correcting steps of the current generation may be used instead of the database on the defect correcting steps of the immediately preceding generation. Alternatively, the database on the defect correcting steps of the immediately preceding generation and that of the current generation may be used together. Next, ratios of killer defect number which can be corrected for the number of killer defects targeted for correction are computed for the opaque and clear defects, respectively, and further, a correction enable function is obtained for each of the opaque and clear defects. This function is provided as a function for the killer defect number which can be corrected while the defect size is defined as a variable.

Next, the killer defect number $\lambda_O$ of opaque defects considering correction enable or disable and the killer defect number $\lambda_C$ considering whether correction is enabled or disabled are computed based on a correction enable coefficient of each of the above-described opaque and clear defects; and the killer defect numbers of the above-described opaque and clear defects. Then, the killer defect number λ of all the defects considering whether correction is enabled or disabled is computed in accordance with the following formula.

$\lambda=\lambda_O+\lambda_C$

Further, the yield of masks is predicted by the formula expressed below.

Yield=exp(−λ)

As this value increases, for example, in the case of Yield=80, it is predicted that the yield is easily increased. On the other hand, in the case where Yield=60, it is predicted that the yield is generally reduced. However, even in the case of Yield=60, if a sufficient amount of time and cost is applied to the defect repairing steps, it is predicted that the yield can be increased.

This means that, in the case of Yield=80, the manufacture of a photomask can be carried out as compared with the case of Yield=60, and the photomask manufacturing cost can be reduced. Conversely, in the case of Yield=60, this means that the manufacture of a photomask is difficult as compared with the case of Yield=80 and that the photomask manufacturing cost is increased. That is, as the yield value increases, it is possible to predict that the photomask manufacturing cost can be reduced.

In this manner, according to the present embodiment, the mask defect specification is taken into consideration, and further, critical area analysis is carried out separately with respect to opaque and clear defects, whereby a practical method for predicting the yield of a photomask can be achieved. As a result, photomask price setting or design correction can be predicted in advance at the stage of photomask design.

In the present embodiment, although the mask defect specification determined for each design rule has been used as mask defect information, the defect size presented from a photomask user may be used. In this case, even if the design rules are identical to each other, the defect size which is different depending on each layer configuring a device on a wafer may be presented.

Fifth Embodiment

The fifth embodiment of the invention is different from the fourth embodiment in that the influence of a defect (mask defect) on a photomask upon a wafer is used as mask defect information. The influences of a mask defect upon a wafer include the influence upon a pattern transferred on a wafer (transferred pattern) (lithographic point of view), or the influence upon features of a device formed on a wafer (device features). Hereinafter, a detailed description of the present embodiment will be given by way of example of using the influence upon a transferred pattern on a wafer as the influence of a mask defect upon a wafer.

Figure 29:
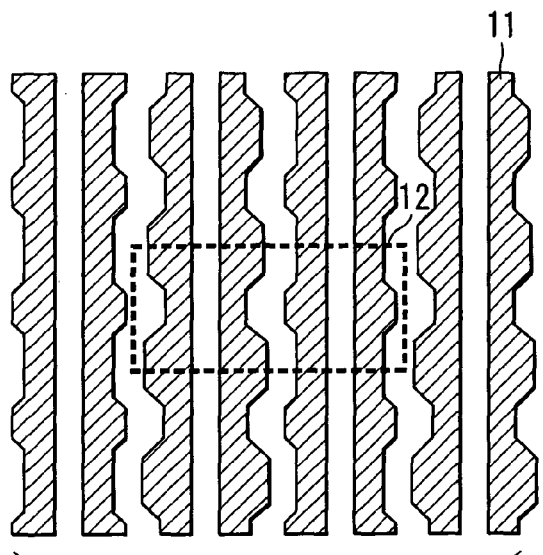
FIG. 29 is a view showing design pattern data (GDS data) according to the fifth embodiment.

First, as shown in FIG. 29, design pattern data (GDS data) 11 is prepared. In the figure, a region enclosed by broken line indicates a basic cell 12. The design pattern data 11 is included in CAD data.

Next, as shown in FIG. 30A to FIG. 30G, seven patterns adding defects D1 to D7 whose shape is square is prepared on the basic cell 12. Defects D1 to D4 indicate black defects, and defects D5 to D7 indicate white defects.

Portions (defect portions) on the design pattern data where defects D1 to D7 exist are defined as portions which are different from each other in influence upon a transferred pattern in the case where a mask defect has existed on a photomask corresponding to these portions.

A plurality of portions whose pattern faces are different from each other may be simply selected in order to eliminate a work for checking that these portions are different from each other in influence upon a transferred pattern. This is because, if the pattern faces are different from each other, in general, the influence upon a transferred pattern is also different from another one.

Next, as shown in FIG. 31, a pattern of 50, 100, 150, 200 nm$^\square$ is prepared in size (defect size) "a" of one edge of defect D1, and further, a pattern of 50, 100, 150, 200 nm$^\square$ is prepared in defect size "a" of defects D2 to D7, similarly.

With respect to a pattern set to a=500, 100, 150, 200 nm$^\square$ for each of seven patterns shown in FIG. 30A to FIG. 30G and a basic cell (defect free pattern) at which no defect is disposed, the light intensity distribution formed at a resist on a wafer is computed in the case where a ⅔ ring band illumination of λ=248 nm, NA=0.68, σ=0.75 is used.

Then, using the light intensity distribution relevant to a defect free pattern, the exposure amount (threshold value) Ie required for exposure of the defect free pattern is acquired by means of computation. Further, for each of seven patterns shown in FIG. 30A to FIG. 30G, in the case where a pattern set to a=5, 100, 150, 200 nm$^\square$ is exposed with exposure amount Ie, the dimension $CD_{def}$ of the defect portion transferred onto a resist on a wafer is acquired from the above computed light intensity distribution.

FIG. 32 shows a computation example of the light intensity distribution of a defect free pattern (a=100) and a pattern (a=100) shown in FIG. 8A. At the lower side of FIG. 32, there is shown the light intensity distribution formed at a resist on a wafer by means of the exposure light passing through portions indicated by the dotted line extending in a horizontal direction at the upper side of FIG. 32. In addition, the light intensity distribution in the range of X=0.22 to 0.44 at the lower side of FIG. 32 is provided as the light intensity distribution between the center lines C at the upper side of FIG. 32.

Figure 30A:
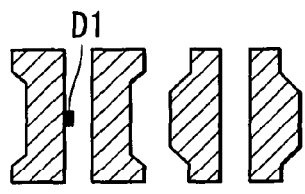
FIG. 30A to FIG. 30G are plan views each showing a pattern in which a square shaped defect has been added onto a basic cell.
Figure 30B:
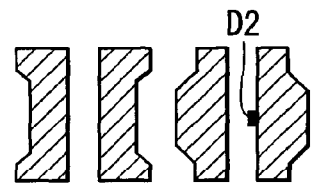
Figure 30C:
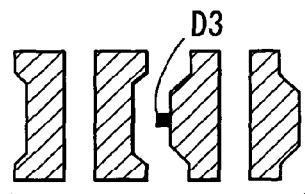
Figure 30D:
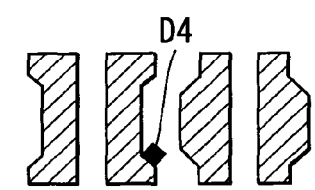
Figure 30E:
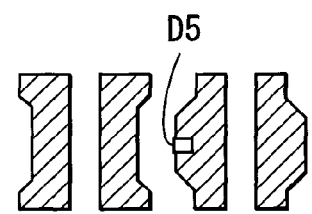
Figure 30F:
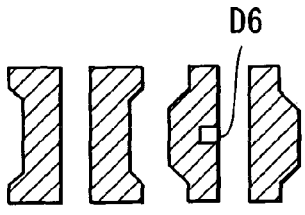
Figure 30G:
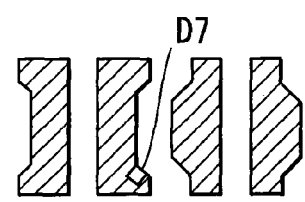
Figure 33:
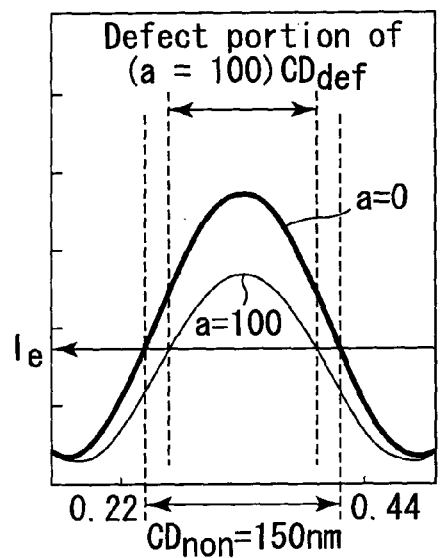
FIG. 33 is a view showing a computation example of dimensions of a defect portion in the pattern (a=100) shown in FIG. 30A transferred onto a resist.

FIG. 33 shows a computation example of the dimension $CD_{def}$ of the defect portion of a pattern (a=100) shown in FIG. 30A transferred onto a resist. $CD_{def}$ is equal to a distance between two cross points, i.e., a distance between light intensity Ie' (light intensity corresponding to exposure amount Ie) and the light intensity distribution of a pattern (a=100) shown in FIG. 30A. In addition, the dimension $CD_{non}$ of a defect portion of a pattern (a) shown in FIG. 30A transferred onto a resist, namely, the distribution of a defect free portion, is equal to a distance between two cross points, the light intensity=Ie' and the light intensity distribution of the pattern (a=0) shown in FIG. 30A.

Figure 34:
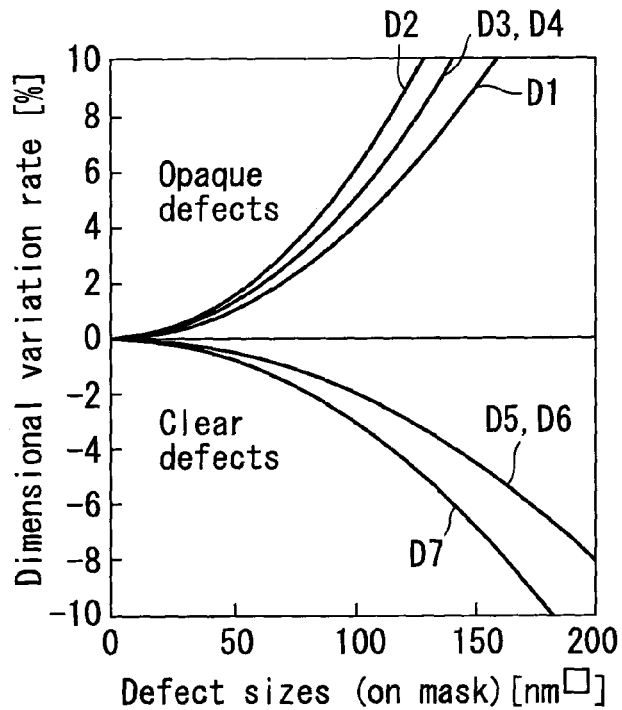
FIG. 34 is a view showing a relationship between a defect size and a dimensional variation rate.

Next, a difference ($CD_{def}$-$CD_{non}$) between the above computed distribution $CD_{def}$ of the transferred pattern of the defect portion and the dimension $CD_{non}$ of the transferred pattern of the defect free portion is computed. The thus computed difference is divided by the dimension $CD_{non}$ of the pattern of the defect free portion, and then, is multiplied by 100. The thus obtained value is defined as a dimensional variation rate. That is, dimensional variation rate={($CD_{def}$-$CD_{non}$)/$CD_{non}$}×100. FIG. 34 shows a relationship between the defect side "a" and the dimensional variation rate relevant to defects D1 to D7.

Next, from FIG. 34, a defect size (allowable defect size) corresponding to the allowable dimensional variation rate of the transferred pattern (resist pattern) to be formed on a wafer is computed with respect to defects D1 to D7 each.

Figure 35:
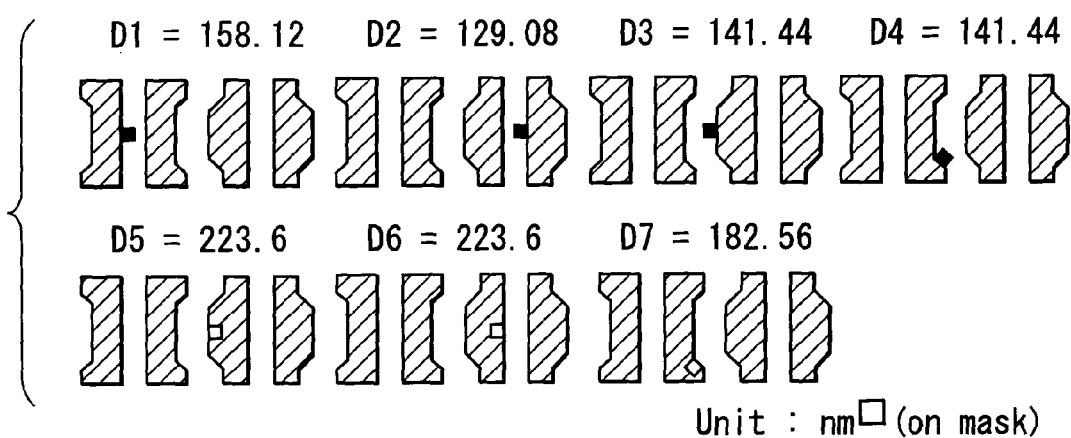
FIG. 35 is a view showing a computation result of an allowable defect size.

FIG. 35 shows a computation result of the allowable defect size of defects D1 to D7 each. In the present embodiment, the allowable dimensional variation rate of the transferred pattern (resist pattern) is defined as ±10%. The allowable dimensional variation rate is given by 100×(dimensional variation rate of transferred pattern)/(design dimensions of transferred pattern). The above computed defect side is obtained as an allowable defect side on a photomask. There is no need to detect a mask defect on a region corresponding to this allowable defect size by the inspecting apparatus. This is because the above-described mask defect does not have an effect on a wafer. In this way, there is no need to detect a mask defect on a region corresponding to the allowable defect size, whereby the detection count of pseudo defects can be reduced.

Figure 36:
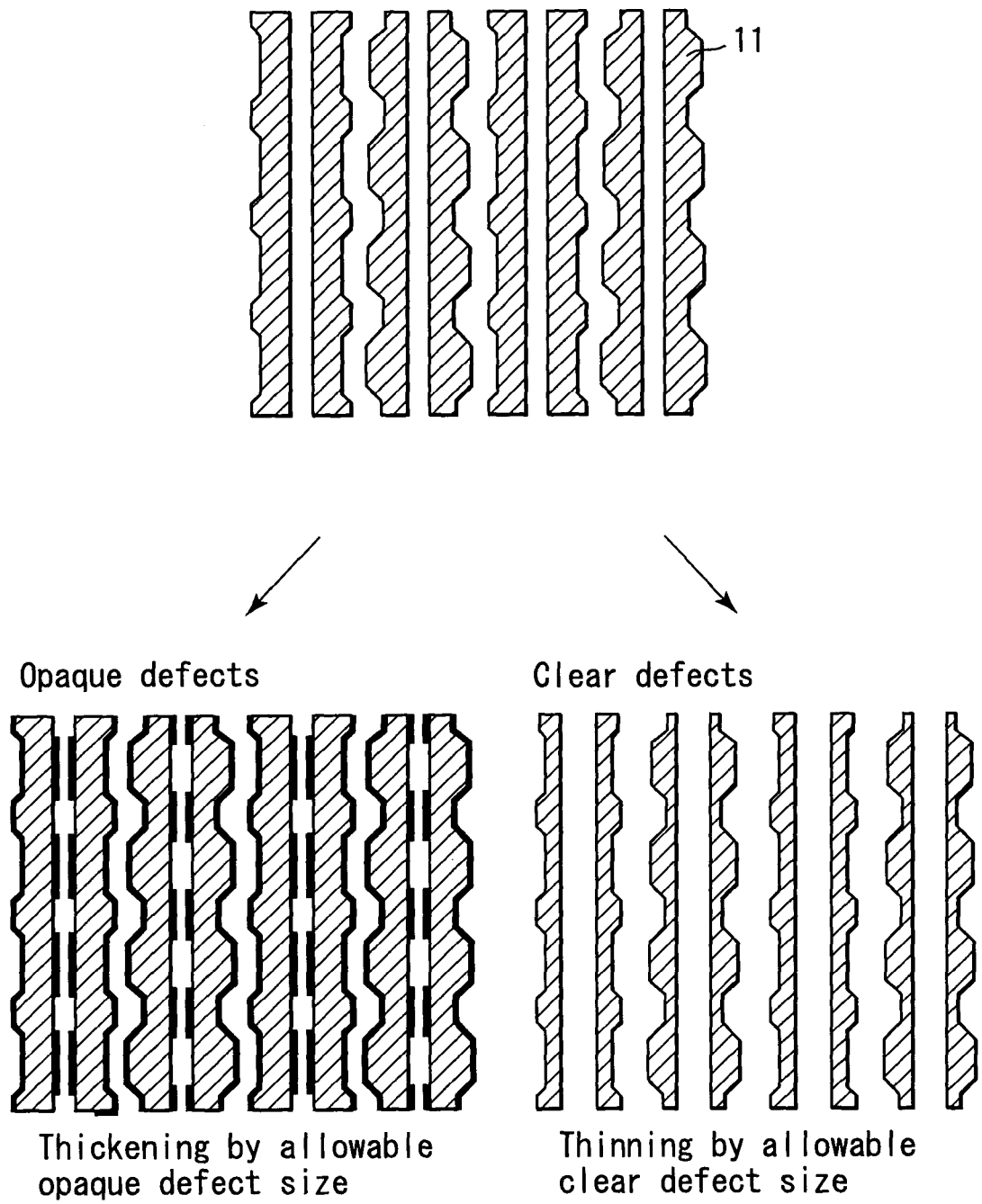
FIG. 36 is a view showing the steps of (procedures for) carrying out resize processing of black and white defects separately by the allowable defect size with respect to design pattern data.

Next, as shown in FIG. 36, for each of seven portions at which defects D1 to D7 have been allocated, resize processing is carried out separately for opaque and clear defects with respect to design pattern data (GDS data) by the above computed allowable defect sizes each (corresponding to ΔL according to the first embodiment).

Hereinafter, design pattern data 11 resized considering the allowable defect size of the opaque and clear defects each is referred to as pattern data considering black defects and pattern data considering clear defects, respectively, as in the fourth embodiment.

Next, as in FIG. 27A and FIG. 27B according to the fourth embodiment, with respect to the pattern data considering opaque defects and pattern data considering clear defects, the critical area relevant to the opaque defects and clear defects corresponding to the size of radius R=0, 50, 75, 100, 125, 150, 175, 200, 225, 275, 300 nm$^\square$ is obtained on a photomask in accordance with a geometry technique, whereby the critical area Ac (R) is acquired.

In this way, the critical area (in the present embodiment) acquired with respect to the pattern data considering opaque defects and the pattern data considering clear defects is occasionally smaller than the critical area acquired with respect to design pattern data 11 which is not subjected to resize compensation based on the influence of a mask defect upon a wafer.

This means that, even a photomask judged to be a faulty product in Comparative Example is occasionally judged to be a good product in the method according to the present embodiment. That is, by using data obtained by reflecting on design pattern data the information on the influence of a mask defect upon a wafer, an error of misjudging a good product to be a faulty product is reduced. As a result, a possibility of underestimating the yield of photomasks can be reduced.

Next, as in the first embodiment, based on data on the sizes of defects on a photomask and the number of defects for each size per unit square area on the photomask (opaque defect data and clear defect data), the defect density distribution D (R) is acquired separately with respect to opaque defects and clear defects.

Next, using Ac (R) and D (R) corresponding to the opaque and clear defects, the killer defect number considered to have an effect on a wafer is obtained by means of computation with respect to each of the opaque and clear defects in accordance with the following definition.

Killer defect number=∫Ac(R)D(R)dR

The killer defect number used here indicates the number of mask defects which is considered to have an effect on dimensions of a transferred pattern.

Next, as in the fourth embodiment, information on how well correction can be carried out in defects to be corrected is acquired for the opaque and clear defects separately; a ratio of the correction enable killer defect number relevant to the killer defect number targeted to be corrected is computed for the opaque and clear defects, separately; and a correction enable function for each of the opaque and clear defects can be obtained.

Next, the killer defect number $\lambda_O$ of opaque defects considering whether correction is enabled or disabled and the killer defect number $\lambda_C$ of clear defects considering whether correction is enabled or disabled are computed based on the correction enable coefficient of each of the opaque and clear defects and the killer defect number of the opaque and clear defects. Then, the killer defect number $\lambda$ of all the defects considering whether correction is enabled or disabled is computed in accordance with the formula below.

$\lambda=\lambda_O+\lambda_C$

Further, the mask yield is predicted in accordance with the formula expressed below.

Yield=exp(−λ)

As this value increases, for example, in the case of Yield=80, it is predicted that the yield is easily increased. On the other hand, in the case of Yield=60, it is predicted that the yield is generally reduced as compared with the case of Yield=80. However, even in the case of Yield=60, if a large amount of time and cost are applied to the defect correcting steps, it is predicted that the yield can be increased.

In the case of Yield=80, the manufacture of photomasks is facilitated as compared with the case of Yield=60, and the photomask manufacturing cost can be reduced. Conversely, this means that, in the case of Yield=60, the manufacture of photomasks is difficult as compared with the case of Yield=80, and the photomask manufacturing cost is increased. That is, as the yield value increases, it is possible to predict that the photomask manufacturing cost can be reduced.

In this way, according to the present embodiment, the influence of a mask defect upon a transferred pattern formed on a wafer is taken into consideration, and further, critical area analysis is carried out for the opaque and clear defects, separately, whereby a practical method for predicting the yield of photomasks can be achieved. As a result, photomask price setting or design correction can be predicted in advance at the stage of photomask design.

In comparison between the fourth embodiment and the fifth embodiment, it becomes evident that the prediction of the yield of photomasks according to the fifth embodiment has higher precision. The reason is stated below. That is, in the fourth embodiment, the pattern widths of design pattern data have been judged to be uniformly thick or thin. However, in the fifth embodiment, the pattern widths of design pattern data have been changed from a place to another place. In other words, the mask defect information used in the second embodiment is considered to be more reliable than that used in the first embodiment.

In the present embodiment, although the influence on a mask defect upon a pattern transferred onto a wafer has been considered, the influence upon operation (features) of a device to be formed on a wafer may be taken into consideration. The device operation (features) used here denotes an operation (features) concerning a device to be generally checked. The operations (features) concerning the above device include enabling handling of a leak current when a gate is turned OFF or precisely enabling write or readout operation.

In addition, the above-described method for evaluating a photomask can be carried out as a computer program product having recorded therein a program to be executed by a computer, as in the third embodiment. The above-described computer program products include disks such as CD-ROM and DVD, for example.

Specifically, as shown in FIG. 20, a disk 21 is configured to store program instructions for execution on a computer system enabling the computer system 22 to perform generating pattern data considering defects by using a defect inspection information used in inspecting defects on a photomask, the pattern data considering defects representing design pattern data of the photomask on which information concerning the defects is reflected; computing a critical area distribution with respect to the pattern data considering defects and estimating a defect density distribution with respect to a relationship between sizes of defects on the photomask and number of defects of the sizes per unit square area on the photomask; acquiring information concerning number of defects on the photomask based on the critical area distribution and the defect density distribution; and evaluating the photomask based on the information concerning the number of defects on the photomask. Further, a variety of specific steps in the above-described evaluating method may be executed as procedures.

In the method for evaluating a photomask according to the above-described embodiments, when a critical area is computed, resize processing of an allowable defect size from design data has been applied only to a cell portion. However, resize processing may be carried out in a region including a peripheral circuit portion without being limited to the cell portion.

Further, when the allowable defect size is computed, lithography simulation has been carried out by allocating a square shaped defect to pattern data. However, it is possible to carry out resize processing for the allowable defect size (defect inspection level corresponding to each place) from design data.

Furthermore, although defects have been used when a critical area is computed, it is possible to carry out similar computation even by using a dimensional error (CD error) on a photomask. Although critical area computation has been carried out in accordance with the geometry technique, such computation may be carried out in accordance with the Monte Calro technique.

Moreover, in order to predict the yield of photomasks, although the formula of Yield=exp(−λ) has been used, the yield prediction may be carried out in accordance with another formula (system).

As target photomasks, there are employed, for example, a half tone mask for use in light exposure such as KrF exposure, ArF exposure, $F_2$ exposure, or EUV exposure; masks other than a half tone mask such as a Levenson mask or a COG mask, for example, or masks for use in non-optical exposure of EB stepper, X-ray and the like.

In addition, in the above-described embodiments, although the format of design pattern data has been GDS, another format may be used.

Additional advantages and corrections will readily occur to those skilled in the art. Therefore, the invention in its broader aspects is not limited to the specific details and representative embodiments shown and described herein. Accordingly, various corrections may be made without departing from the spirit or scope of the general inventive concept as defined by the appended claims and their equivalents.

What is claimed is:

1. A mask defect inspecting method comprising:
   preparing detection sensitivities of defects on a plurality of portions of a mask pattern on a photomask, the detection sensitivities being determined according to influences of the defects upon a wafer, the influences of the defects upon the wafer being influences upon dimensions of a transferred pattern to be formed on the wafer, the detection sensitivities including a plurality of detection sensitivities which are different from each other, the influences of the defects including a plurality of influences of the defects which are different from each other, the plurality of detection sensitivies corresponding to the plurality of influences wherein a lower detection sensitivity corresponds to a smaller influence; and
   inspecting defects on the plurality of portions based on the detection sensitivities.

2. The mask defect inspecting method according to claim 1, wherein preparing the detection sensitivities comprises:
   preparing a control pattern for controlling the photomask and a first exposure amount required for finishing a transferred pattern in a predetermined dimension, the transferred pattern corresponding to the control pattern and being formed on the wafer;
   changing widths of the plurality of portions of the mask pattern, acquiring second exposure amounts required for finishing a plurality of portions of a transferred pattern in a predetermined dimension, the plurality of portions of the transferred pattern corresponding to the plurality of portions having changed thereat widths of the mask pattern and being formed on the wafer, and computing variation rates of the second exposure amounts with respect to the first exposure amount;
   acquiring influences of defects upon the wafer based on the variation rates of second exposure amounts with respect to the first exposure;
   acquiring detection sensitivities of defects based on the influences of defects upon the wafer; and
   generating a map of the influences of defects upon the wafer based on the detection sensitivities of defects.

3. The mask defect inspecting method according to claim 1, wherein the mask pattern includes a pattern configuring a device, and preparing the detection sensitivities comprises:
   preparing a control pattern for controlling the photomask and a first exposure amount required for finishing a transferred pattern in a predetermined dimension, the transferred pattern corresponding to the control pattern and being formed on the wafer;
   obtaining variations of widths of the plurality of portions of the photomask, the variations of the widths corresponding to a boundary between presence and absence of influences upon a feature of a device, acquiring second exposure amounts required for finishing a plurality of portions of transferred pattern in a predetermined dimension, the plurality of portions of transferred pattern corresponding to the plurality of portions having changed thereat widths by the variations of the mask pattern and being formed on the wafer, and computing variation rates of the second exposure amounts with respect to the first exposure amount;
   acquiring influences of defects upon the wafer based on the variation rates of the second exposure amounts with respect to the first exposure amount;
   acquiring detection sensitivities of defects based on the influences of defects; and
   generating a map of the influences of defects based on the detection sensitivities of defects.

4. The mask defect inspecting method according to claim 2,
   wherein computing the variation rates of the second exposure amounts with respect to the first exposure amount comprises:
   changing the widths of the plurality of portions of the mask pattern by a plurality of values and acquiring a plurality of second exposure amounts for each of the plurality of values; and
   computing variation rates of the plurality of second exposure amounts with respect to the first exposure amount for each of the plurality of values.

5. The mask defect inspecting method according to claim 1, further comprising:
   generating a defect influence map representing influences of defects upon the wafer; and
   inspecting defects on the plurality of portions based on the defect influence map.

6. A mask defect inspecting apparatus comprising:
   a map generating portion to generate an influence map representing influences of defects on a plurality of portions of a mask pattern on a photomask upon a wafer based on detection sensitivities of the defects determined according to influences of the defects upon the wafer, the influences of the defects upon the wafer being influences upon dimensions of a transferred pattern to be formed on the wafer, the detection sensitivities including a plurality of detection sensitivities which are different from each other, the influences of the defects including a plurality of influences of the defects which are different from each other, the plurality of detection sensitivities corresponding to the plurality of influences wherein a lower detection sensitivity corresponds to a smaller influence; and an inspecting portion to inspect defects on the plurality of portions based on the influence map.

7. A defect influence map generating method comprising:

preparing detection sensitivities of defects on a plurality of portions of a mask pattern on a photomask, the detection sensitivities being determined according to influences of the defects upon a wafer, the influences of the defects upon the wafer being influences upon dimensions of a transferred pattern to be formed on the wafer, the detection sensitivities including a plurality of detection sensitivities which are different from each other, the influences of the defects including a plurality of influences of the defects which are different from each other, the plurality of detection sensitivities corresponded to the plurality of influences wherein the lower detection sensitivity corresponds to the smaller influence; and generating an influence map including the influences of the defects upon the wafer based on the detection sensitivities of the defects.

8. A photomask evaluating method comprising:

generating pattern data considering defects by using a defect inspection information used in inspecting defects on a photomask, the pattern data considering defects representing design pattern data of the photomask on which information concerning the defects is reflected;

computing a critical area distribution with respect to the pattern data considering defects and estimating a defect density distribution with respect to a relationship between sizes of defects on the photomask and number of defects of the sizes per unit square area on the photomask, wherein the computing of the critical area distribution comprises computing the critical area distribution with respect to opaque defects and clear defects separately, and wherein the estimating of the defect density distribution comprises estimating the defect density distribution with respect to the opaque defects and the clear defects separately;

acquiring information concerning number of defects on the photomask based on the critical area distribution and the defect density distribution, wherein the acquiring of information concerning the number of defects comprises acquiring a sum of a number of killer defects of the opaque defects and a number of killer defects of the clear defects; and evaluating the photomask based on the information concerning the number of defects on the photomask.

9. The photomask evaluating method according to claim 8, wherein the critical area distribution is a distribution with respect to a relationship between size of the defects on the pattern in the case where defects are virtually provided on a pattern defined by the pattern data considering defects and a minimum square area of a region causing faults on the pattern in which the center of a defect of the size exists.

10. The photomask evaluating method according to claim 8, wherein the defect inspection information includes sizes of defects to be detected on the photomask, the sizes being determined with respect to each design rule.

11. The photomask evaluating method according to claim 8, wherein type of sizes of defects to be detected on the photomask is one for each design rule.

12. The photomask evaluating method according to claim 8, wherein the defect inspection information includes influences of defects on a plurality of portions of the mask pattern upon a wafer.

13. The photomask evaluating method according to claim 8, wherein the influences of the defects upon a wafer are influences upon a dimension of a transferred pattern to be formed on the wafer.

14. The photomask evaluating method according to claim 8, wherein generating the pattern data considering defects comprises: reflecting information concerning defects on the photomask on the design pattern data so as to reduce the number of pseudo defects to be detected on the photomask.

15. The photomask evaluating method according to claim 8, wherein estimating the defect density dimension comprises: using at least one of a database concerning defect correcting steps for a pattern of a design rule whose generation is earlier than that of a pattern on the photomask and a database concerning defect correcting steps for a pattern of a design rule whose generation is identical to that of a pattern on the photomask.

16. The photomask evaluating method according to claim 8, wherein evaluating the photomask comprises: predicting the yield of the photomasks.

17. The photomask evaluating method according to claim 8, wherein evaluating the photomask comprises predicting a yield of the photomasks by using a formula of Yield=exp$(-\lambda)$, where $\lambda$ is the sum of the number of killer defects of the opaque defects and the number of killer defects of the clear defects.

* * * * *

UNITED STATES PATENT AND TRADEMARK OFFICE
CERTIFICATE OF CORRECTION

PATENT NO. : 7,295,304 B2
APPLICATION NO. : 10/654527
DATED : November 13, 2007
INVENTOR(S) : Yamaguchi et al.

It is certified that error appears in the above-identified patent and that said Letters Patent is hereby corrected as shown below:

Claim 1, column 23, line 46, change "sensitivies" to --sensitivities--.

Signed and Sealed this

First Day of April, 2008

JON W. DUDAS
*Director of the United States Patent and Trademark Office*